US010930669B2

(12) United States Patent
Hu et al.

(10) Patent No.: US 10,930,669 B2
(45) Date of Patent: Feb. 23, 2021

(54) THREE DIMENSIONAL MEMORY DEVICE AND METHOD FOR FABRICATING THE SAME

(71) Applicant: MACRONIX INTERNATIONAL CO., LTD., Hsinchu (TW)

(72) Inventors: Chih-Wei Hu, Toufen (TW); Teng-Hao Yeh, Hsinchu (TW); Yu-Wei Jiang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/273,301

(22) Filed: Feb. 12, 2019

(65) Prior Publication Data

US 2020/0258898 A1    Aug. 13, 2020

(51) Int. Cl.
| | | |
|---|---|---|
| *H01L 27/11582* | (2017.01) | |
| *H01L 27/11565* | (2017.01) | |
| *H01L 29/792* | (2006.01) | |
| *H01L 23/528* | (2006.01) | |
| *H01L 21/768* | (2006.01) | |
| *H01L 21/311* | (2006.01) | |

(Continued)

(52) U.S. Cl.
CPC ... *H01L 27/11582* (2013.01); *H01L 21/31111* (2013.01); *H01L 21/76829* (2013.01); *H01L 21/76897* (2013.01); *H01L 23/5226* (2013.01); *H01L 23/5283* (2013.01); *H01L 27/11565* (2013.01); *H01L 29/40117* (2019.08); *H01L 29/7926* (2013.01)

(58) Field of Classification Search
CPC ......... H01L 27/11582; H01L 27/11556; H01L 27/11578; H01L 27/11551; H01L 27/11565; H01L 29/7926; H01L 29/7889
See application file for complete search history.

(56) References Cited

U.S. PATENT DOCUMENTS

2011/0065270 A1\* 3/2011 Shim ................ H01L 27/11582
438/589
2014/0264525 A1\* 9/2014 Takahashi ......... H01L 27/11563
257/314

(Continued)

OTHER PUBLICATIONS

TW Office Action dated Sep. 26, 2019, Taiwan Application No. 108104660, pp. 1-5.

*Primary Examiner* — Mohammed Shamsuzzaman
*Assistant Examiner* — Aaron J Gray
(74) *Attorney, Agent, or Firm* — McClure, Qualey & Rodack, LLP

(57) ABSTRACT

A three-dimensional memory device includes a substrate, conductive layers and insulating layers, a storage layer, a first channel, a second channel and a first conductive plug. The conductive layers and insulating layers are alternately stacked over the substrate to form a multi-layer stacked structure. The storage layer penetrates through the multi-layer stacked structure, and has a first string portion and a second string portion that are spaced from each other. The first channel is located on a lateral side of the first string portion. The second channel is located on a lateral side of the second string portion. The first channel and the second channel have an upper channel portion and a lower channel portion. The first conductive plug is interconnected between the upper channel portion and the lower channel portion.

15 Claims, 24 Drawing Sheets

(51) Int. Cl.
  *H01L 23/522* (2006.01)
  *H01L 21/28* (2006.01)

(56) References Cited

U.S. PATENT DOCUMENTS

| | | | |
|---|---|---|---|
| 2014/0273373 A1* | 9/2014 | Makala | H01L 21/8221 |
| | | | 438/270 |
| 2014/0284697 A1 | 9/2014 | Wang et al. | |
| 2017/0154892 A1* | 6/2017 | Oh | H01L 23/5283 |
| 2018/0182771 A1* | 6/2018 | Costa | H01L 27/1157 |

* cited by examiner

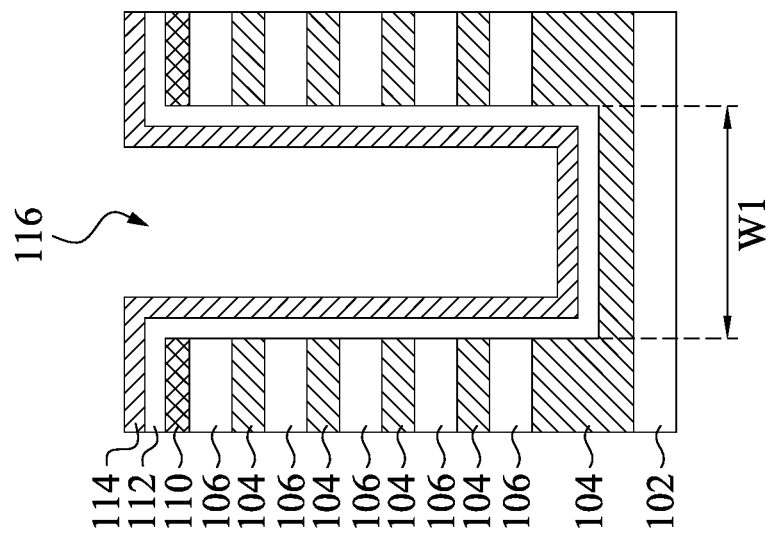
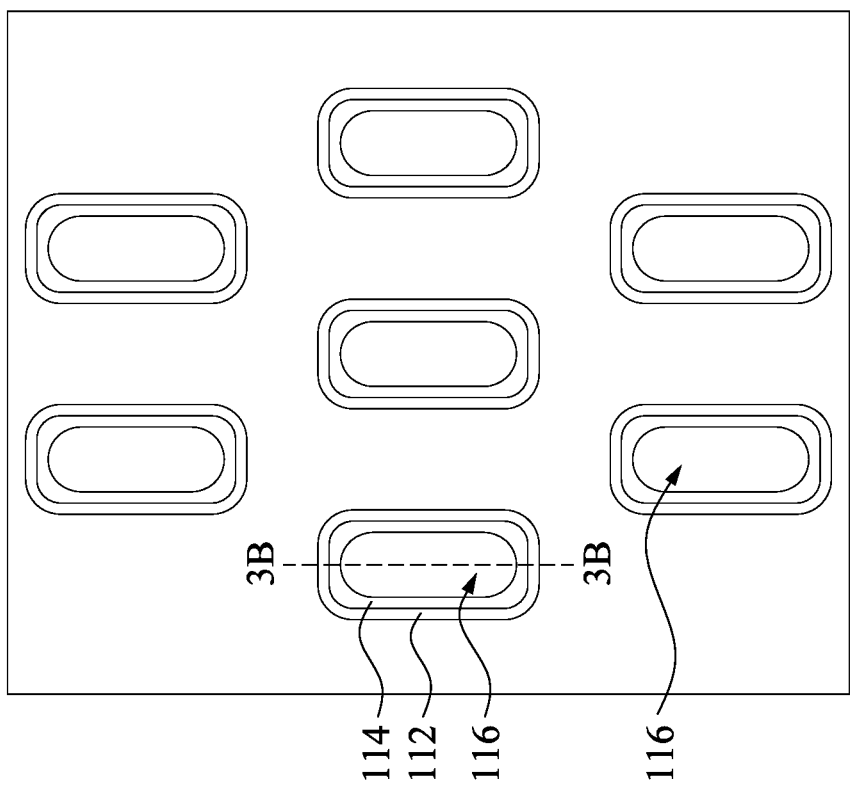
Fig. 3B
Fig. 3A

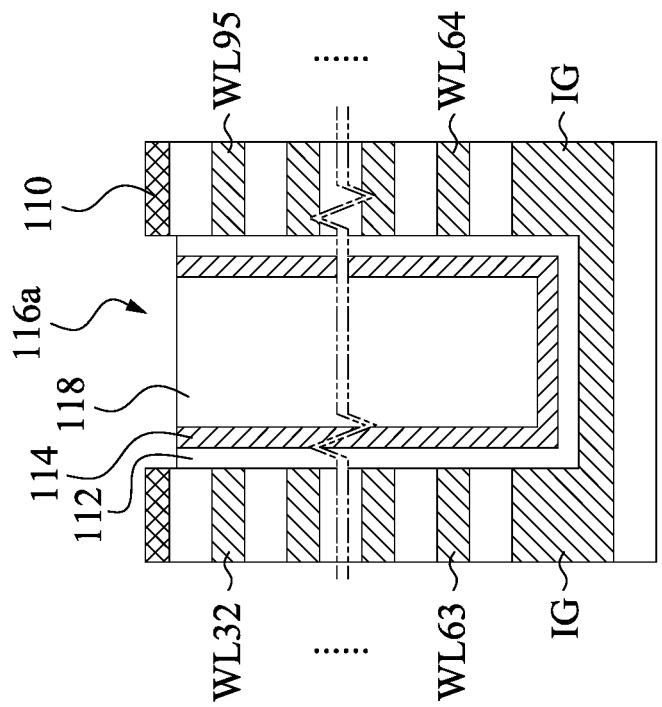
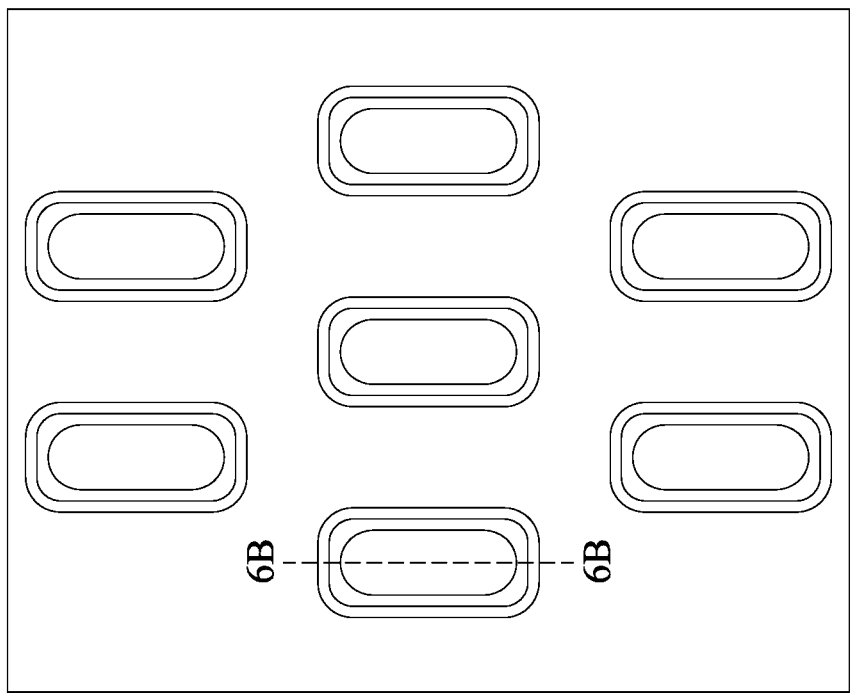
Fig. 6B
Fig. 6A

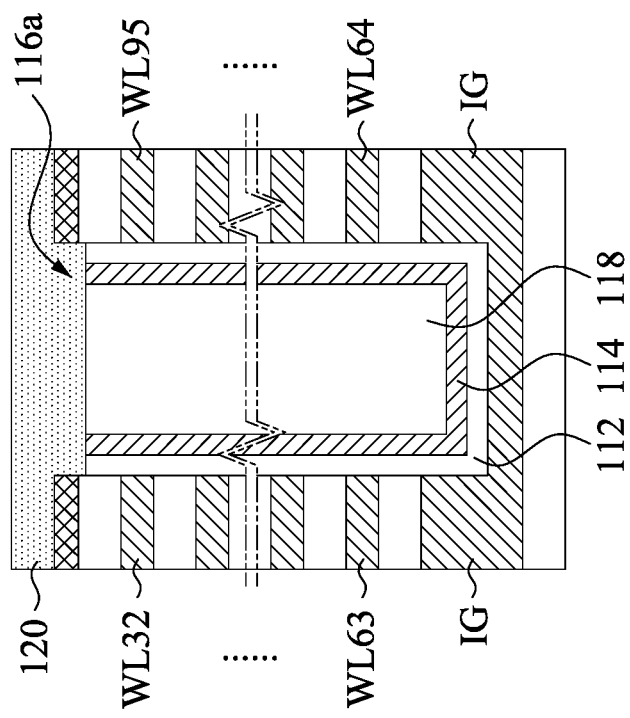
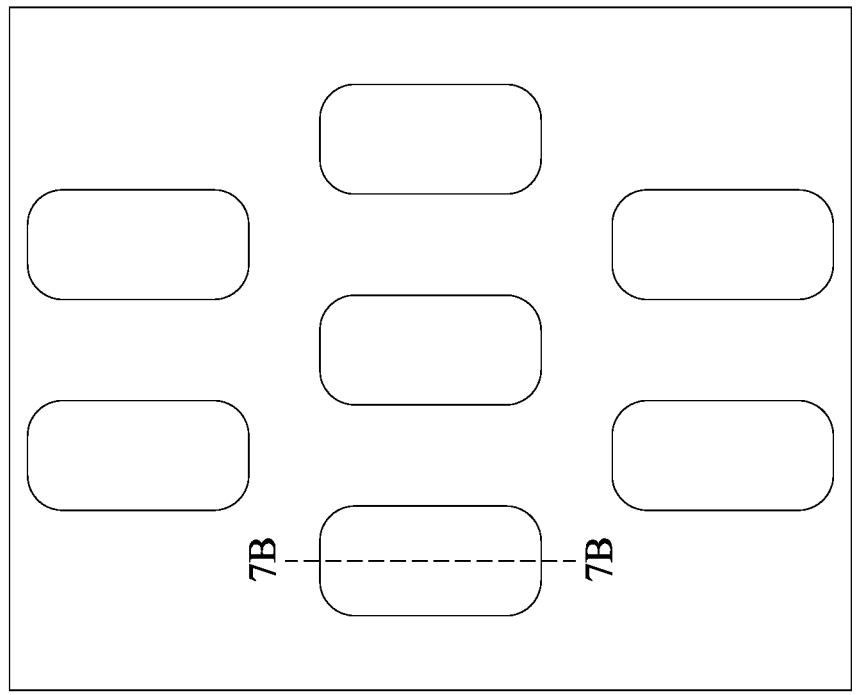
Fig. 7B
Fig. 7A

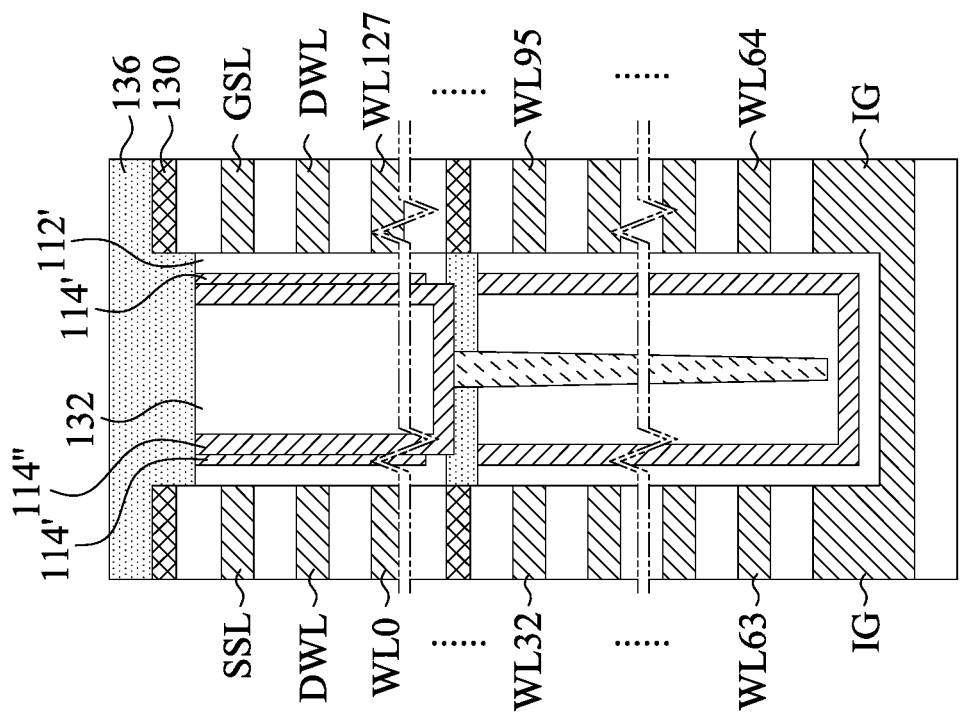
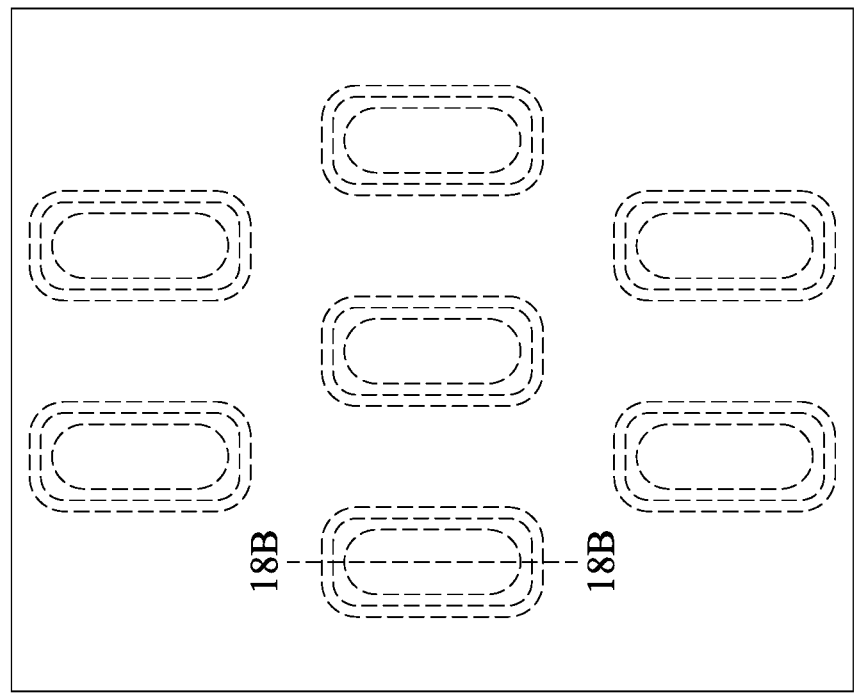
Fig. 18B
Fig. 18A

THREE DIMENSIONAL MEMORY DEVICE AND METHOD FOR FABRICATING THE SAME

BACKGROUND

Field of Invention

The present disclosure relates to a memory device and method for fabricating the same, and more particularly to a high-density three dimensional (3D) memory device and method for fabricating the same.

Description of Related Art

Memory devices are important device to a portable electric apparatus, such as a MP3 displayer, a digital camera, a notebook, a cell phone . . . and so on, for data storage. As the increasing applications and functions required by the users, the trend for the memory devices pursues higher storage density and smaller cell size. To satisfy this requirement, designers have been looking for techniques to provide a 3D memory device with stacked multiple planes of memory cells, such as a vertical-channel (VC) NAND flash memory device.

However, as critical dimensions of devices in integrated circuits shrink to the limits of common memory cell technologies, how to achieve greater storage capacity within a smaller memory device by a conventional process equipment with associated compatibility limitations have become a challenge to the persons skilled in the art. Therefore, there is a need of providing an improved 3D memory device and the method for fabricating the same to obviate the drawbacks encountered from the prior art.

SUMMARY

One aspect of the present disclosure is to provide a three-dimensional memory device including a substrate, a plurality of conductive layers and insulating layers, a storage layer, a first channel, a second channel and a first conductive plug. The conductive layers and insulating layers are alternately stacked over the substrate to form a multi-layer stacked structure. The storage layer penetrates through the multi-layer stacked structure, and has a first string portion and a second string portion that are spaced from each other. The first channel is located on a lateral side of the first string portion, and the first string portion is arranged between the multi-layer stacked structure and the first channel. The second channel is located on a lateral side of the second string portion, and the second string portion is arranged between the multi-layer stacked structure and the second channel, wherein the first channel and the second channel have an upper channel portion and a lower channel portion. The first conductive plug is interconnected between the upper channel portion and the lower channel portion.

In one or more embodiments, the memory device further includes an etch stop layer located in the multi-layer stacked structure and at a side of the first conductive plug.

In one or more embodiments, the memory device further includes a bottom channel, and the lower channel portions of the first channel and the second channel are U-shaped channel portions that are spaced from each other and connected to two opposite ends of the bottom channel.

In one or more embodiments, the upper channel portion has a bottom end in contact with the first conductive plug.

In one or more embodiments, the memory device further includes a second conductive plug above the multi-layer stacked structure and connected to the upper channel portion.

In one or more embodiments, the memory device further includes an etch stop layer above the multi-layer stacked structure and at a side of the second conductive plug.

In one or more embodiments, the first conductive plug and the second conductive plug are made from doped poly silicon.

In one or more embodiments, the upper channel portion includes an outer channel layer and an inner channel layer, and the outer channel layer is located between the storage layer and the inner channel layer and spaced from the first conductive plug.

Another aspect of the present disclosure is to provide a three-dimensional memory device including a substrate, a plurality of conductive layers and insulating layers, a storage layer, a first channel, a second channel and a dielectric feature. The conductive layers and insulating layers are alternately stacked over the substrate to form a multi-layer stacked structure. The storage layer penetrates through the multi-layer stacked structure, and has a first string portion and a second string portion that are spaced from each other. The first channel is in contact with the first string portion. The second channel is in contact with the second string portion. The dielectric feature is located between the first channel and the second channel. The dielectric feature having a lower portion and an upper portion, and a top of the lower portion having a cross section wider than that of a bottom of the upper portion.

In one or more embodiments, the upper portion or the lower portion of the dielectric feature has a taper cross section.

In one or more embodiments, each of the first and second channels has an upper channel portion and a lower channel portion.

In one or more embodiments, the memory device further includes a first conductive plug interconnected between the upper channel portion and the lower channel portion.

Still another aspect of the present disclosure is to provide a method for fabricating a three-dimensional memory device including steps of alternately depositing multiple first conductive layers and first insulating layers over a substrate to form a multi-layer stacked structure; etching a first hole through the first conductive layers and first insulating layers; depositing a first storage layer in the first hole; depositing a lower channel over the first storage layer; depositing a first conductive plug layer in contact with the lower channel; alternately depositing multiple second conductive layers and second insulating layers over the first conductive plug layer; etching a second hole through the second conductive layers and the second insulating layers to expose the first conductive plug layer; depositing a second storage layer in the second hole; depositing a second channel layer over the second storage layer; etching the second storage layer and the second channel layer to expose the first conductive plug layer, and the etched second channel layer is remained on a sidewall of the second storage layer; depositing a third channel layer over the remaining portion of the second channel layer to form an upper channel in contact with the first conductive plug layer; and depositing a second conductive plug layer in contact with a top of the upper channel.

In one or more embodiments, the method further includes a step of etching a first trench to cut the first conductive plug layer, the first storage layer and the lower channel; and depositing a first dielectric feature into the first trench before depositing the multiple second conductive layers and second insulating layers.

In one or more embodiments, the method further includes a step of etching a second trench to cut the second conductive plug layer, the second storage layer and the upper channel to expose the first dielectric feature; and depositing a second dielectric feature into the second trench and in contact with the first dielectric feature.

In one or more embodiments, the method further includes a step of depositing an etch stop layer over a top one of the first insulating layers, wherein the etch stop layer has a material different from that of the top one of the first insulating layers.

A hemi-cylindrical semiconductor memory device utilizes multiple-step etching scheme to increase a total aspect ratio by using a conventional etching tool with a normal etching capability is still able to fabricate a high density hemi-cylindrical semiconductor memory device.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 2A-22A illustrate top views of a method for manufacturing a semiconductor memory device at various stages in accordance with some embodiments of the present disclosure;

FIGS. 2B-22B illustrate cross sectional view of a method for manufacturing a semiconductor memory device at various stages in accordance with some embodiments of the present disclosure;

DETAILED DESCRIPTION

Figure 1:
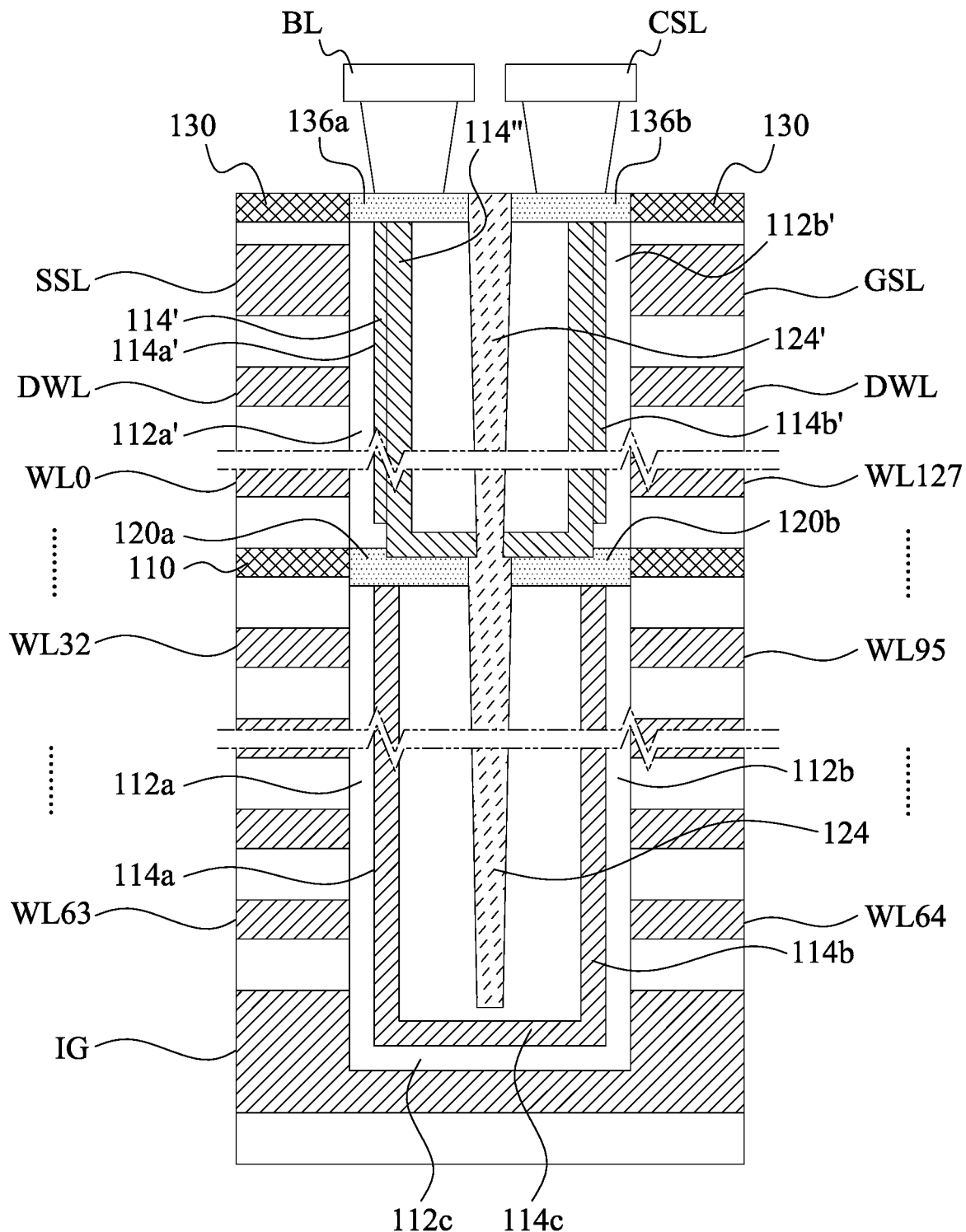
FIG. 1 illustrates a cross sectional view of a three dimensional semiconductor memory device in accordance with one embodiment of the present disclosure.

The embodiments as illustrated below provide a 3D memory device and the method for fabricating the same to achieve greater storage capacity within a smaller memory device without deteriorating its operation performance. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

It should be noted that although "first", "second" or the like may be used herein to describe various elements, components, regions, layers and/or portions, these elements, components, regions, layers and/or portions should not be limited by these terms. These terms are only used to distinguish one element, component, region, layer and/or portion from another element, component, region, layer and/or portion.

The terminology used herein is for the purpose of describing particular embodiments of the invention. For example, using "a", "an" and "the" should not be used to limit singular or plural forms of the elements. The word "or" as used herein may mean "and/or". As used herein, the term "and/or" includes any and all combinations of one or more of the associated listed items. It is also noted that the terms "including" or "having" used in the specification, are intended to include features, regions, steps, operations, elements, and/or components, and not intended to exclude addition of other features, regions, steps, operations, elements, and/or components or combinations thereof.

In addition, relative terms such as "lower" or "bottom" and "upper" or "top" may be used herein to describe the relationship of one element to another as shown in drawings. It should be noted that relative terms are intended to encompass different orientations of a device in addition to the orientation as shown in drawings. For example, if a device in one of the figures is turned upside down, the elements described as "under" the other elements will be directed to the "upper" side of the other elements. Accordingly, the exemplary term "lower" may be used to describe "upper" or "lower" according to the orientation of the figures. Similarly, if a device in one of the figures is turned upside down, the elements described as "under" or "lower to" the other elements will be directed to the "upper" side of the other elements. Therefore, the exemplary term "under" or "lower" may encompass the orientations of the "upper" and "lower".

Reference is made to FIG. 1, which illustrates a cross sectional view of a three dimensional semiconductor memory device in accordance with one embodiment of the present disclosure. A semiconductor memory device 100 includes multiple layers, e.g., 64 layers or more, of a lower half layer stack, i.e., a layer stack below an etch stop layer 110, and an upper half layer stack, i.e., a layer stack above the etch stop layer 110 such that the multiple stack does not need to face a deeper hole/trench etch process.

In this embodiment, the lower half layer stack includes multiple conductive layers, e.g., IG or WL32-WL64, and insulating layers alternately stacked over a substrate. The lower half layer stack includes a lower channel portion (114a, 114b, 114c) and a lower storage layer (112a, 112b, 112c). Each segment of lower storage layer (112a, 112b, 112c) is sandwiched between a corresponding segment of the lower channel portion (114a, 114b, 114c) and a corresponding conductive layer, e.g., WL32-WL64, so as to form a memory cell.

In this embodiment, the upper half layer stack includes multiple conductive layers, e.g., SSL, DWL or WL0-WL31, and insulating layers alternately stacked over the etch stop layer 110. The upper half layer stack includes an upper channel portion (114a', 114b') and an upper storage layer (112a', 112b'). Each segment of the upper storage layer (112a', 112b') is sandwiched between a corresponding segment of the upper channel portion (1114a', 114b') and a corresponding conductive layer, e.g., WL0-WL31, so as to form a memory cell.

In this embodiment, a conductive plug (120a, 120b) is interconnected between the upper channel portion (114a', 114b') and the lower channel portion (114a, 114b). Another conductive plug (136a, 136b) is formed above the multi-layer stacked structure and connected to the upper channel portion (114a', 114b'). Therefore, the upper and lower channel portions can be all serially connected by the conductive plugs (120a, 120b, 136a, 136b). In this embodiment, the conductive plugs (120a, 120b, 136a, 136b) may be made from semiconductor materials, e.g., doped semiconductor materials such as doped poly silicon, but not being limited thereto.

In this embodiment, a dielectric feature (124, 124') is located between the channel portions (114a, 114a') and the channel portions (114b, 114b'). In particular, the dielectric feature has a lower portion (124) between the channel portions (114a, 114b) and an upper portion (124') between the channel portions (114a', 114b'). The upper portion (124') and the lower portion (124) of the dielectric feature both have a taper cross section. In some embodiments of the present disclosure, a top of the lower portion (124) may have a cross section wider than that of a bottom of the upper portion (124'). The channel portions (114a, 114a') and the channel portions (114b, 114b') may be referred as a first channel (114a, 114a') and a second channel (114b, 114b').

Figure 2B:
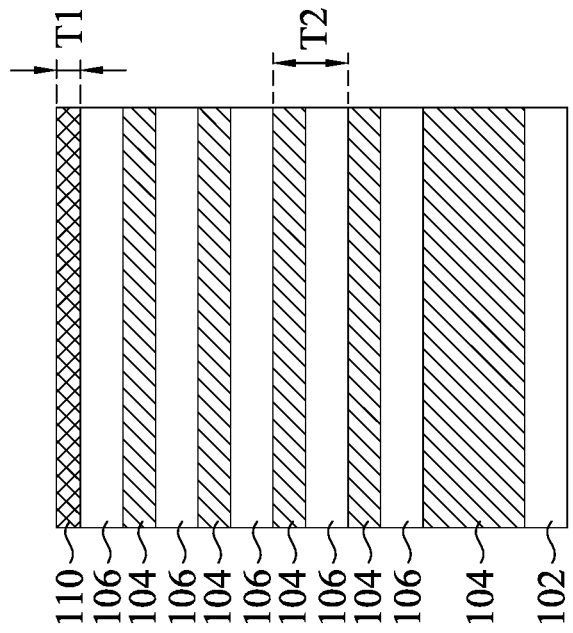
Figure 2A:
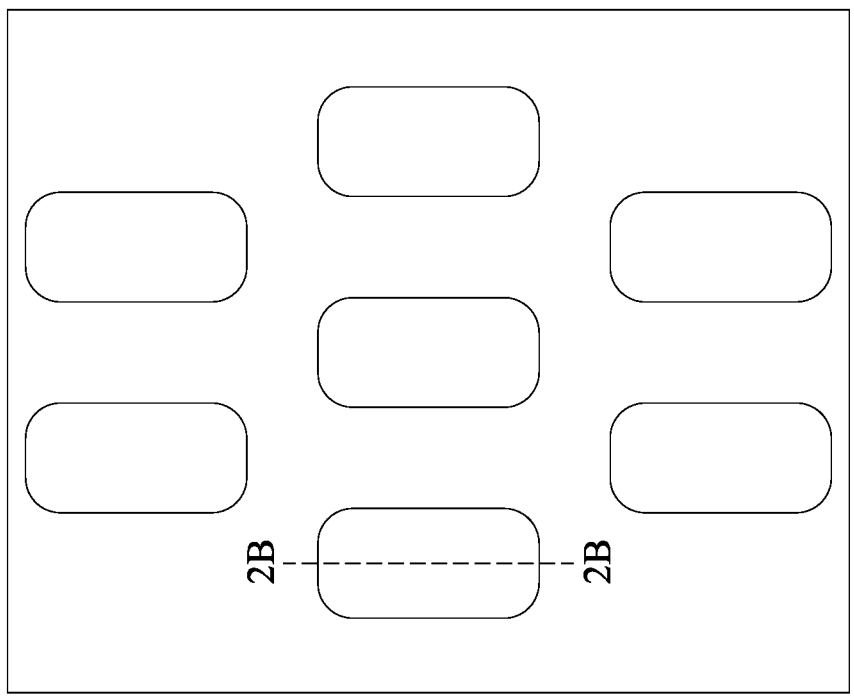

Reference is made to FIGS. 2A and 2B, and FIG. 2B illustrates a cross sectional view taken from the cross sectional line 2B-2B in FIG. 2A. Multiple conductive layers 104 and insulating layers 106 are alternately deposited over a substrate 102 to form a multi-layer stacked structure, e.g., the lower half layer stack in FIG. 1. In some embodiments of the present disclosure, the insulating layers 106 may be made from dielectric materials including oxide materials such as silicon oxide, and the conductive layers 104 may be made from metals (such as Cu, Al, W or the metal ally thereof), doped or undoped semiconductor material (such as epitaxial single crystal silicon or poly-silicon (Si)/germanium (Ge) or other suitable materials. An etch stop layer 110 is further deposited over the multi-layer stacked structure, and the etch stop layer 110 may be made from dielectric materials different from that of the insulating layers 106. In this embodiment, the etch stop layer 110 may be deposited over a top one of the insulating layers 106, and have a thickness (T1) ranging from about 20 nm to about 100 nm. In this embodiment, an average thickness (T2) of a conductive layer 104 and an insulating layer 106 ranges from about 40 nm to about 70 nm.

Reference is made to FIGS. 3A and 3B, and FIG. 3B illustrates a cross sectional view taken from the cross sectional line 3B-3B in FIG. 3A. A etch step is performed to form multiple holes 116 on the multi-layer stacked structure so as to form an array of holes, i.e., multiple rows of holes. Each hole 116 passes through the multi-layer stacked structure (104, 106) and the etch stop layer 110. In some embodiments of the present disclosure, the multiple holes 116 may have an O-shaped, oval-shaped, ellipse-shaped or rounded rectangular circumference, but not being limited thereto. In some embodiments of the present disclosure, an anisotropic etching process, such as reactive ion etching (RIE) process is performed using a patterned hard mask (not shown) as an etching mask, to pattern the multiple holes 116 through the multi-layer stacked structure. In this embodiment, each hole 116 may have a bottom inner width (W1) ranging from about 100 nm to about 250 nm.

A storage layer 112 and a channel layer 114 are then formed over a bottom and a sidewall of each hole 116 by a deposition process, e.g., a low pressure chemical vapor deposition (LPCVD). In some embodiments of the present disclosure, the storage layer 112 may be formed of a composite layer including a silicon oxide layer, a silicon nitride layer, and a silicon oxide layer (i.e., an ONO layer stack). However, the structure of the storage layer is not limited to this regard. In some other embodiments, the storage layer may be selected from a group consisting of an oxide-nitride-oxide-nitride-oxide (ONONO) structure, a silicon-oxide-nitride-oxide-silicon (SONOS) structure, a bandgap engineered silicon-oxide-nitride-oxide-silicon (BE-SONOS) structure, a tantalum nitride-aluminum oxide-silicon nitride-silicon oxide-silicon (TANOS) structure and a metal-high-k bandgap-engineered silicon-oxide-nitride-oxide-silicon (MA BE-SONOS) structure. In the present embodiment, the storage layer 112 includes an ONO structure. The channel layer 114 may be made from doped or undoped semiconductor materials, and may be made of poly-silicon in the present embodiment.

Figure 4B:
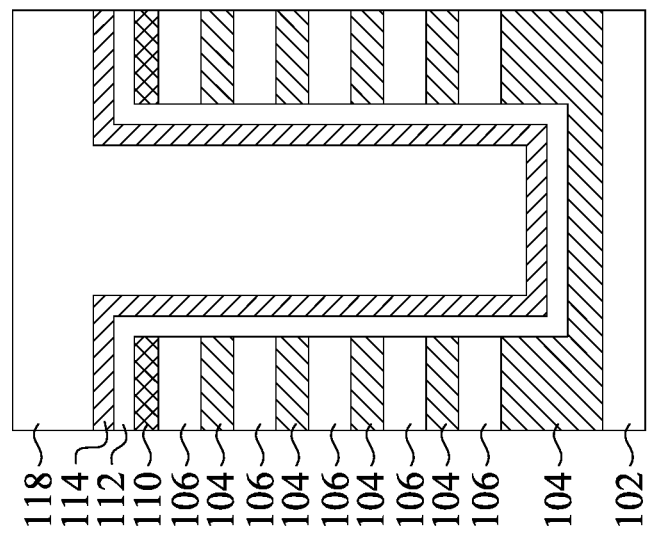
Figure 4A:
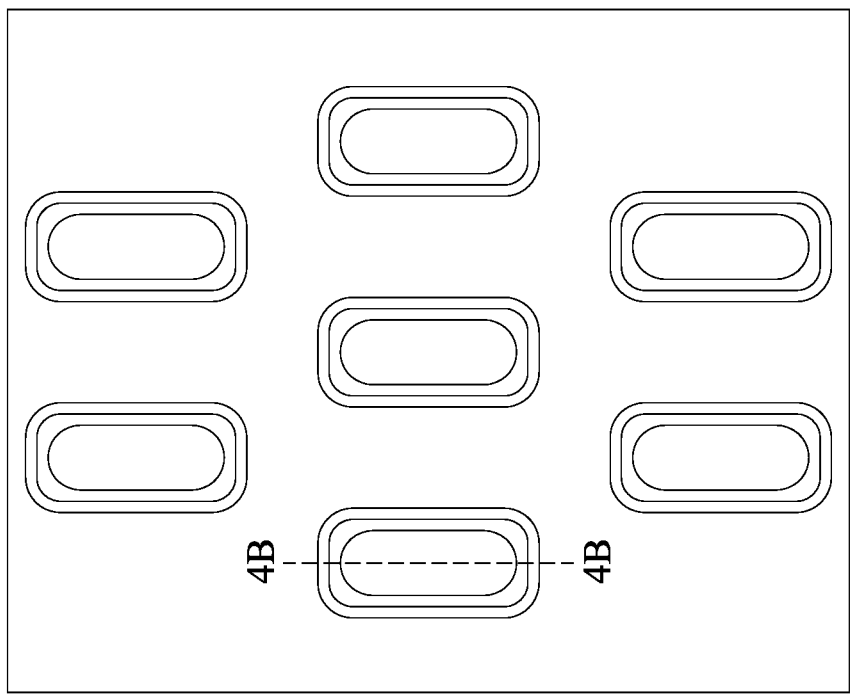

Reference is made to FIGS. 4A and 4B, and FIG. 4B illustrates a cross sectional view taken from the cross sectional line 4B-4B in FIG. 4A. Thereafter, a dielectric pillar 118 is formed into each hole 116 by deposit a dielectric material.

Figure 5B:
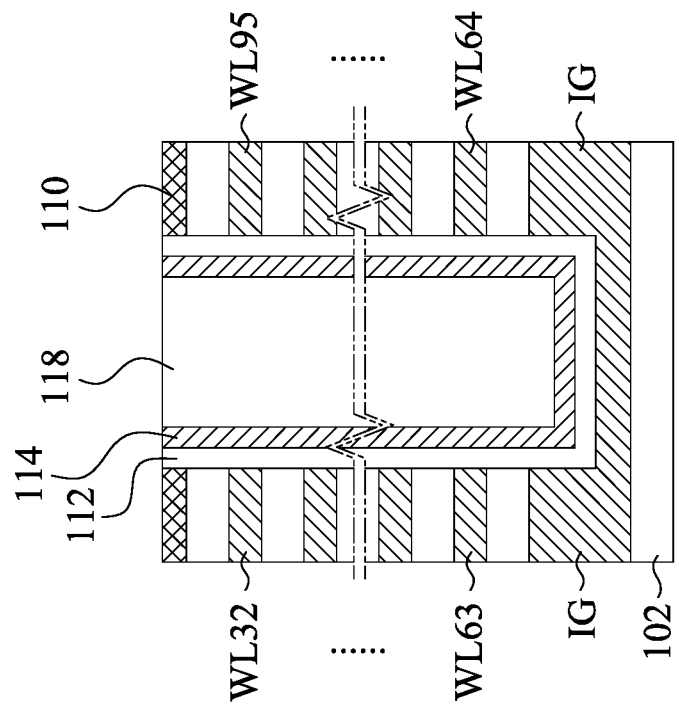
Figure 5A:
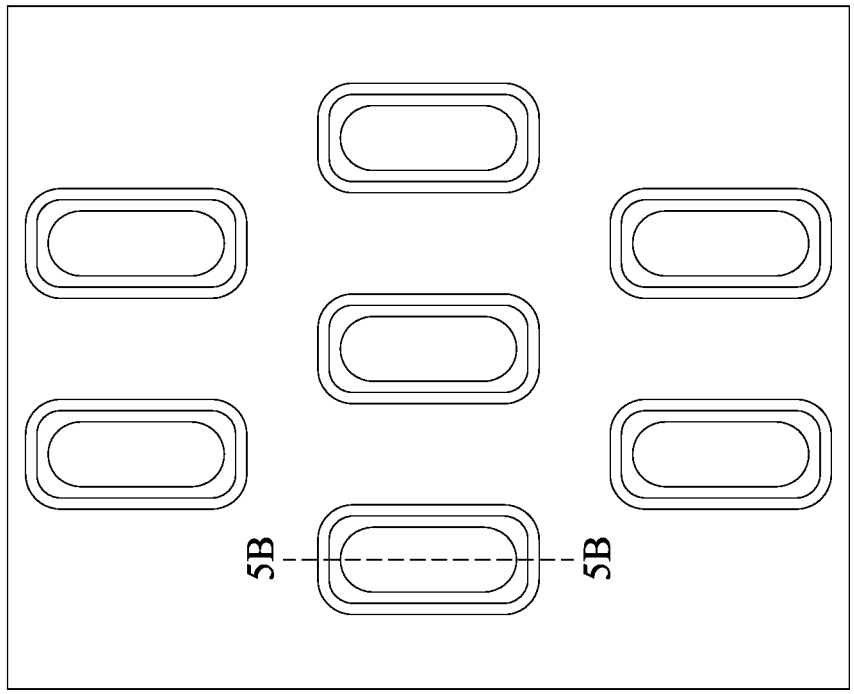

Reference is made to FIGS. 5A and 5B, and FIG. 5B illustrates a cross sectional view taken from the cross sectional line 5B-5B in FIG. 5A. A planarization process, e.g., a CMP process, using the etch stop layer 110 as a stop layer, is performed to remove excess materials. In this embodiment, the conductive layers of the lower half layer stack constitute multiple word lines (WL32-WL63), an inverse gate layer (IG) and multiple word lines (WL64-WL95), but not being limited thereto.

Reference is made to FIGS. 6A and 6B, and FIG. 6B illustrates a cross sectional view taken from the cross sectional line 6B-6B in FIG. 6A. An etching back process is then performed to remove top portions of the dielectric pillar 118, the storage layer 112 and the channel layer 114 to form a recess 116a.

Reference is made to FIGS. 7A and 7B, and FIG. 7B illustrates a cross sectional view taken from the cross sectional line 7B-7B in FIG. 7A. A conductive plug layer 120 is deposited into the recess 116a. The material used to constitute the conductive plug layer may include doped or undoped semiconductor material (such as epitaxial single crystal silicon or poly-silicon (Si)/germanium (Ge) or other suitable material.

Figure 8B:
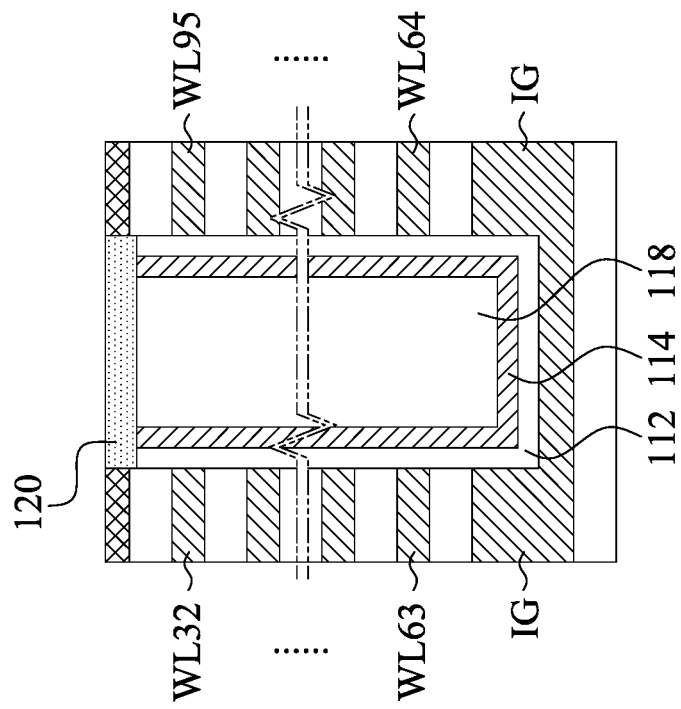
Figure 8A:
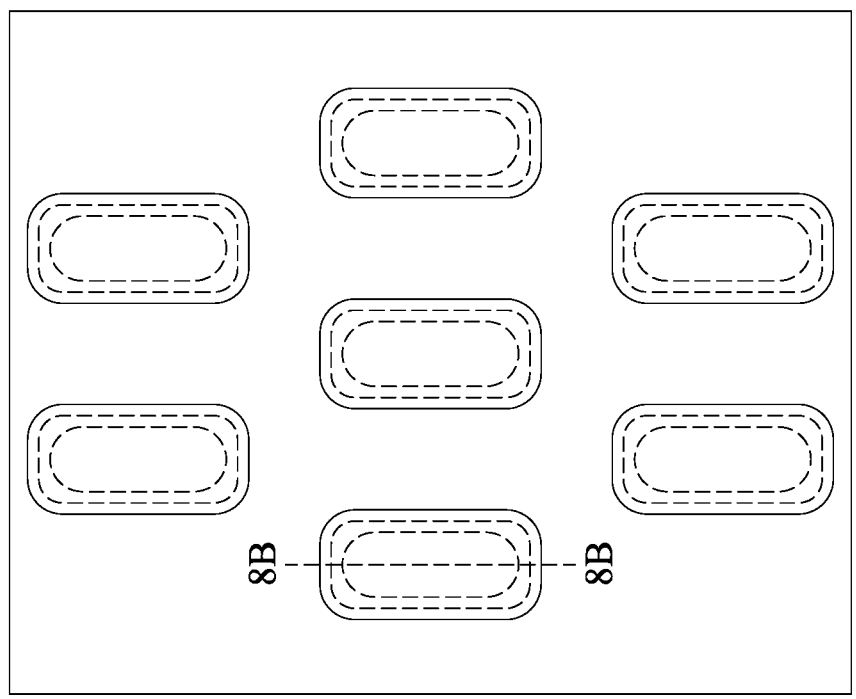

Reference is made to FIGS. 8A and 8B, and FIG. 8B illustrates a cross sectional view taken from the cross sectional line 8B-8B in FIG. 8A. Another planarization process, e.g., a CMP process, using the etch stop layer 110 as a stop layer, is performed to remove excess materials. In this embodiment, the etch stop layer 110 is located at a side of the conductive plug layer 120 or aligned with the conductive plug layer 120. In some embodiments, the etch stop layer 110 and the conductive plug layer 120 may have flush, level top surfaces.

Figure 9B:
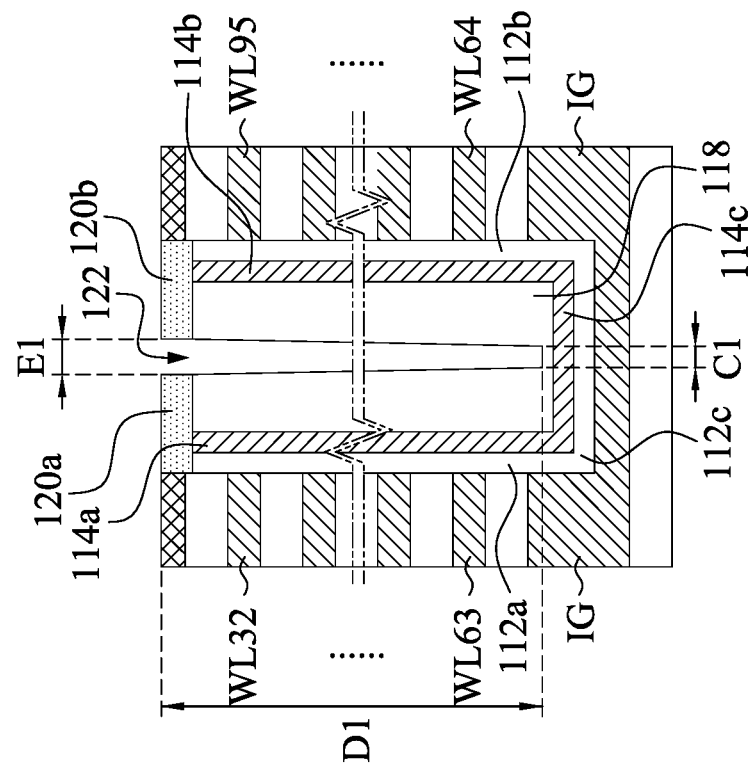
Figure 9A:
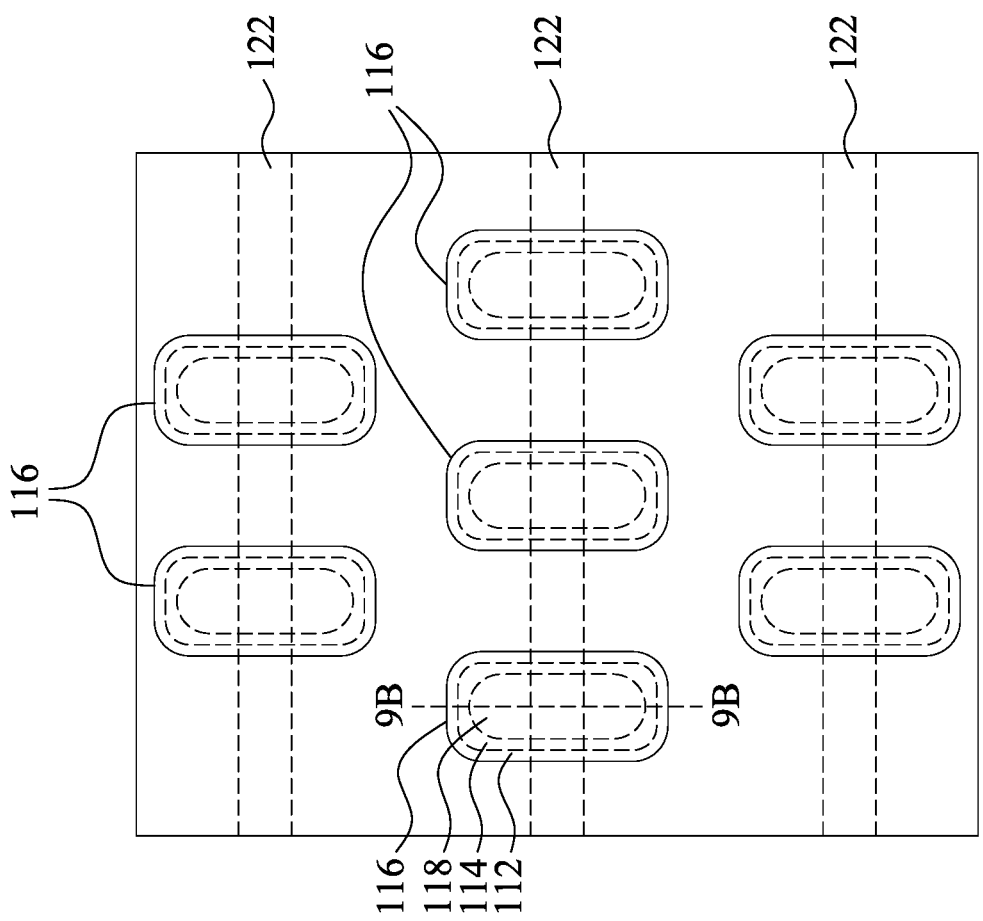

Reference is made to FIGS. 9A and 9B, and FIG. 9B illustrates a cross sectional view taken from the cross sectional line 9B-9B in FIG. 9A. A silt trench 122 is etched across each row of the holes 116 to cut the conductive plug layer 120, the dielectric pillar 118, the storage layer 112 and the channel layer 114. The conductive plug layer 120 is thus divided into two conductive plugs (120a, 120b). The storage layer 112 is thus cut to form a U-shaped string portion 112a located on a first side of a sidewall of each hole 116, a U-shaped string portion 112b located on an opposite second side of the sidewall of each hole 116, but a bottom string portion 112c is not cut by the silt trench 122 and still connected between bottom ends of the string portions (112a, 112b). The channel layer 114 includes a U-shaped channel portion 114a and a U-shaped channel portion 114b that are spaced from each other, but a bottom channel portion 114c is not cut by the silt trench 122 and still connected between bottom ends of the channel portions (114a, 114b). Each conductive plug (120a, 120b) may be made from the same material as that of the channel layer 114, but each conductive plug (120a, 120b) may have a cross section wider than a cross section of the channel layer 114.

In this embodiment, the silt trench 122 has a bottom inner width (C1) ranging from about 30 nm to about 60 nm, a top inner width (E1) from about 50 nm to about 80 nm and an inner depth (D1) ranging from about 1200 nm to about 2400 nm, but not being limited thereto. The silt trench 122 has a taper cross section from its top to its bottom. Generally, an etching capability may achieve an aspect ratio, i.e., D1/C1, less than about 40-60.

Figure 10B:
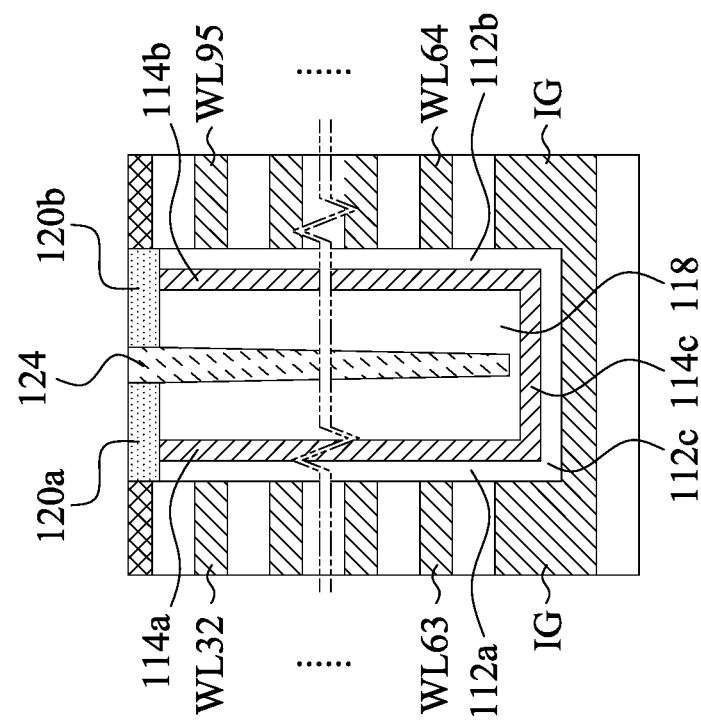
Figure 10A:
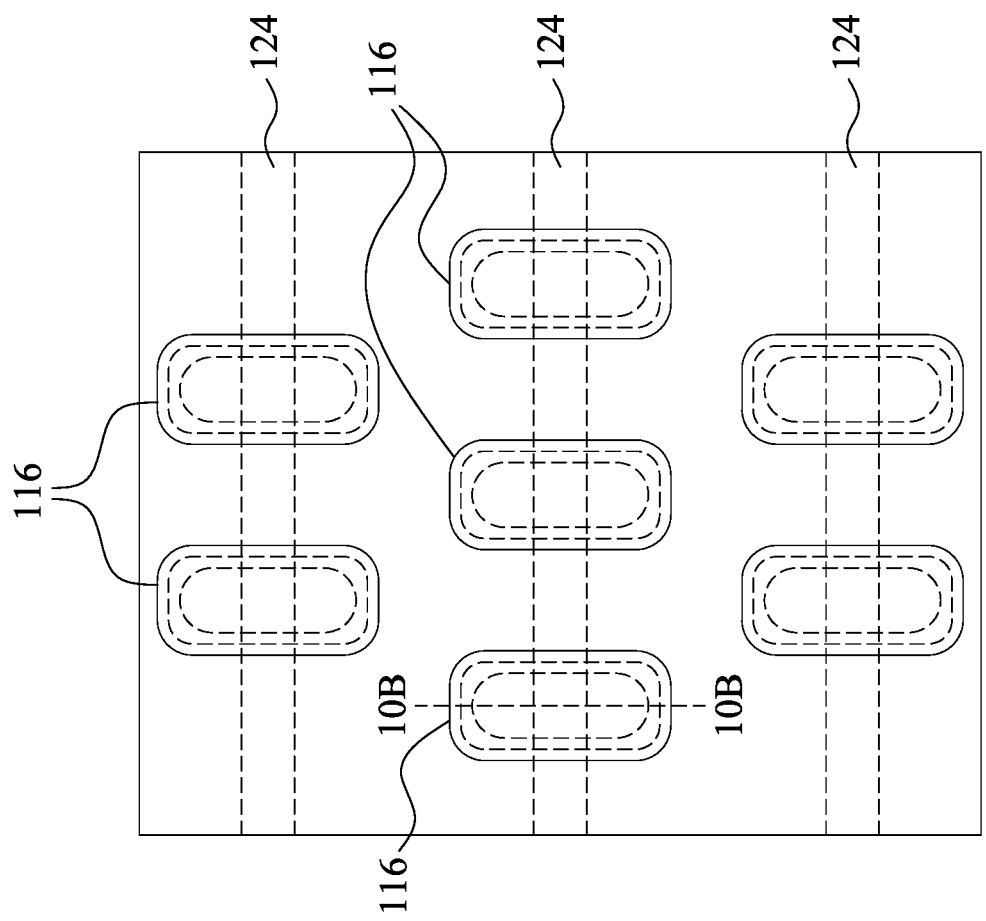

Reference is made to FIGS. 10A and 10B, and FIG. 10B illustrates a cross sectional view taken from the cross sectional line 10B-10B in FIG. 10A. A dielectric material is then filled into the silt trench 122 to form a dielectric feature 124 embedded between the channel portions (114a, 114b) of the channel layer 114, between the string portions (112a, 112b) of the storage layer 112 as well as in the dielectric pillar 118 in the holes 116. The dielectric feature 124 also has a taper cross section from its top to its bottom.

Figure 11B:
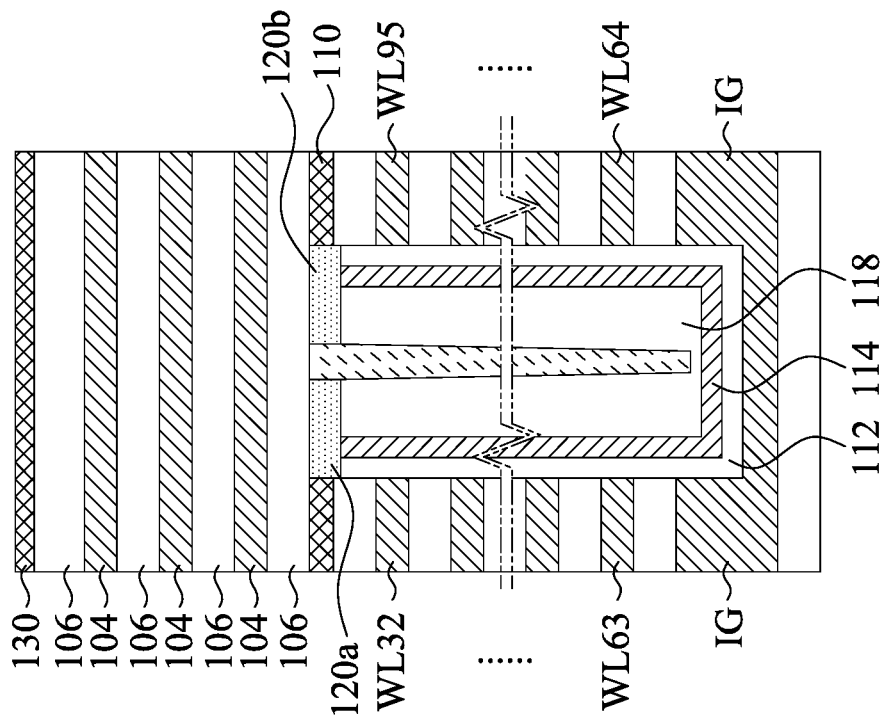
Figure 11A:
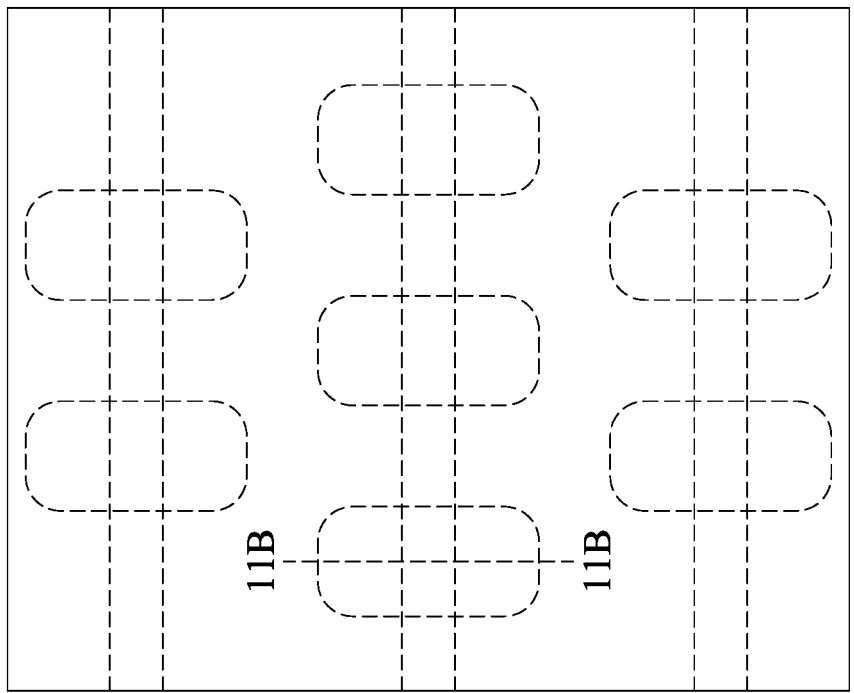

Reference is made to FIGS. 11A and 11B, and FIG. 11B illustrates a cross sectional view taken from the cross sectional line 11B-11B in FIG. 11A. Multiple conductive layers 104 and insulating layers 106 are alternately deposited over the etch stop layer 110 and the conductive plugs (120a, 120b) to form another multi-layer stacked structure, e.g., the upper half layer stack is deposited over the lower half layer stack in FIG. 1. In some embodiments of the present disclosure, the insulating layers 106 may be made from dielectric materials including oxide materials such as silicon oxide, and the conductive layers 104 may be made from metals (such as Cu, Al, W or the metal ally thereof), doped or undoped semiconductor material (such as epitaxial single crystal silicon or poly-silicon (Si)/germanium (Ge) or other suitable materials. An etch stop layer 130 is further deposited over the upper half layer stack, and the etch stop layer 130 may be made from dielectric materials including nitride materials, e.g., silicon nitride, different from that of the insulating layers 106. In this embodiment, the etch stop layer 130 may be deposited over a top one of the insulating layers 106.

Figure 12B:
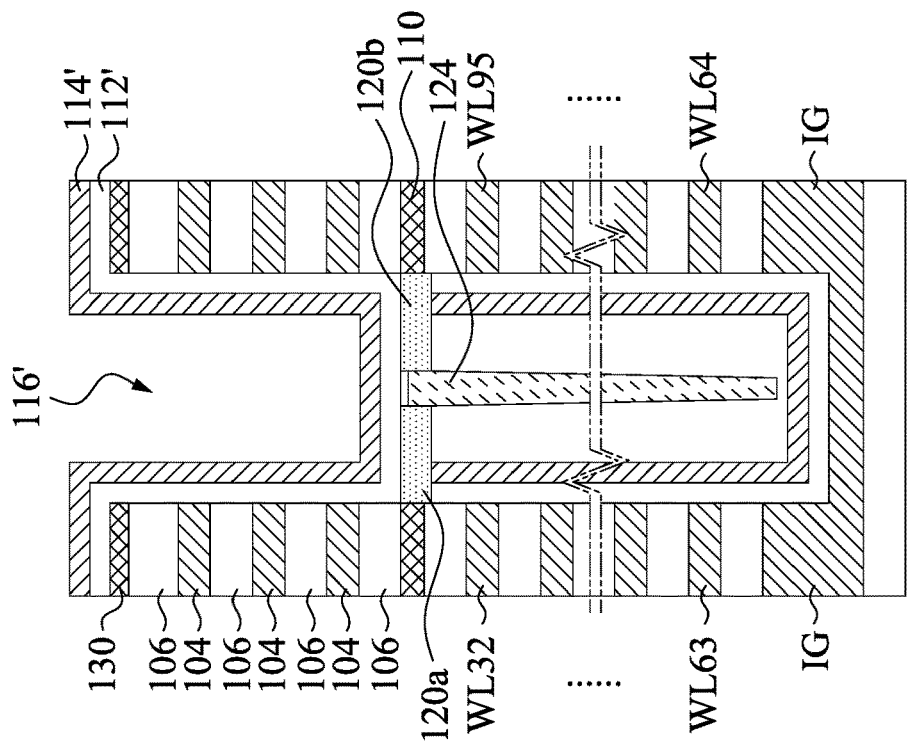
Figure 12A:
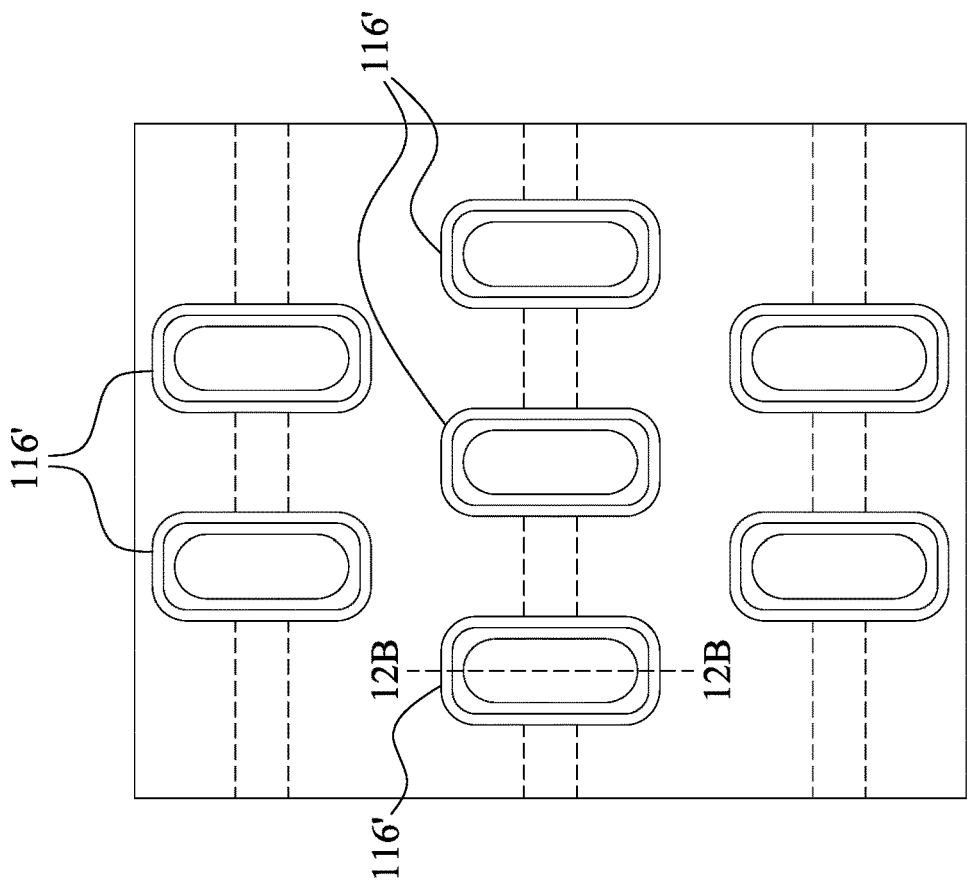

Reference is made to FIGS. 12A and 12B, and FIG. 12B illustrates a cross sectional view taken from the cross sectional line 12B-12B in FIG. 12A. A etch step is performed to form multiple holes 116' on the upper half layer stack so as to form an array of holes, i.e., multiple rows of holes. Each hole 116' is aligned with a corresponding hole 116 underneath in the lower half layer stack. Each hole 116' passes through the multi-layer stacked structure (104, 106) and the etch stop layer 130. In some embodiments of the present disclosure, the multiple holes 116' may have an O-shaped, oval-shaped, ellipse-shaped or rounded rectangular circumference, but not being limited thereto. In some embodiments of the present disclosure, an anisotropic etching process, such as reactive ion etching (RIE) process is performed using a patterned hard mask (not shown) as an etching mask, to pattern the multiple holes 116' through the multi-layer stacked structure.

A storage layer 112' and a channel layer 114' are then formed over a bottom and a sidewall of each hole 116' by a deposition process, e.g., a low pressure chemical vapor deposition (LPCVD). In some embodiments of the present disclosure, the storage layer 112' may be formed of a composite layer including a silicon oxide layer, a silicon nitride layer, and a silicon oxide layer (i.e., an ONO layer stack). However, the structure of the storage layer is not limited to this regard. In some other embodiments, the storage layer may be selected from a group consisting of an oxide-nitride-oxide-nitride-oxide (ONONO) structure, a silicon-oxide-nitride-oxide-silicon (SONOS) structure, a bandgap engineered silicon-oxide-nitride-oxide-silicon (BE-SONOS) structure, a tantalum nitride-aluminum oxide-silicon nitride-silicon oxide-silicon (TANOS) structure and a metal-high-k bandgap-engineered silicon-oxide-nitride-oxide-silicon (MA BE-SONOS) structure. In the present embodiment, the storage layer 112' includes an ONO structure and the channel layer 114' is made of poly-silicon.

Figure 13B:
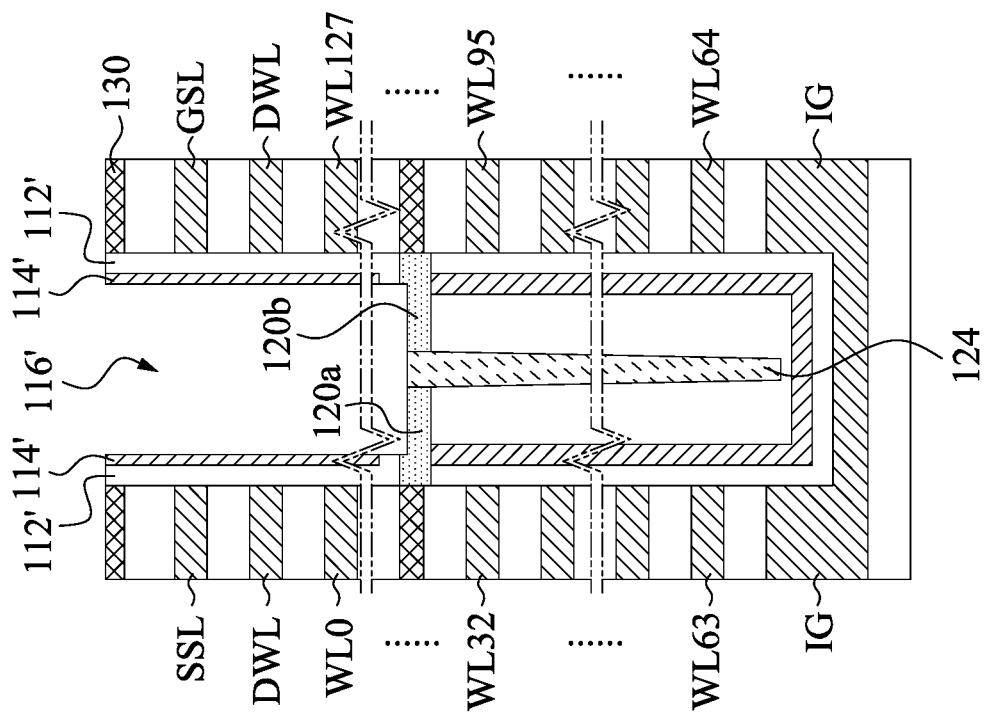
Figure 13A:
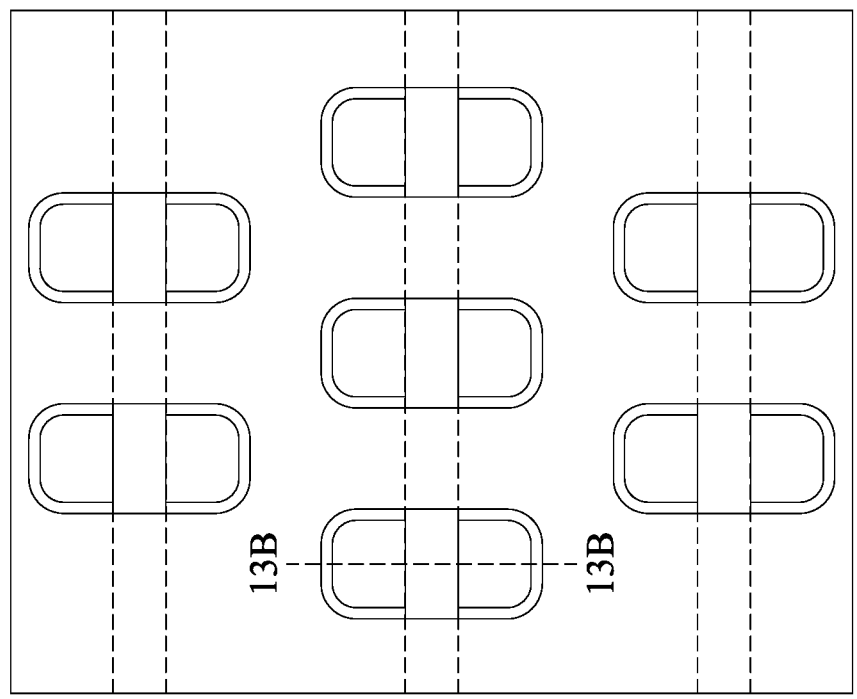

Reference is made to FIGS. 13A and 13B, and FIG. 13B illustrates a cross sectional view taken from the cross sectional line 13B-13B in FIG. 13A. An etching back process is then performed to remove excess channel layer 114' and storage layer 112' to expose top surfaces of the conductive plugs (120a, 120b) and the dielectric feature 124. A remained channel layer 114' is left on a sidewall of the storage layer 112' to serve as a sidewall etch protect. The remained channel layer 114' has its bottommost surface above a bottommost surface of channel layer 114', that is, the channel layer 114' exposes a bottom end of the storage layer 112' and spaced from the conductive plugs (120a, 120b). In this embodiment, the conductive layers of the upper half layer stack constitute a string select line (SSL), a dummy word line (DWL) and multiple word lines (WL0-WL31) as well as a gate select line (GSL), a dummy word line (DWL) and multiple word lines (WL96-WL127).

Figure 14B:
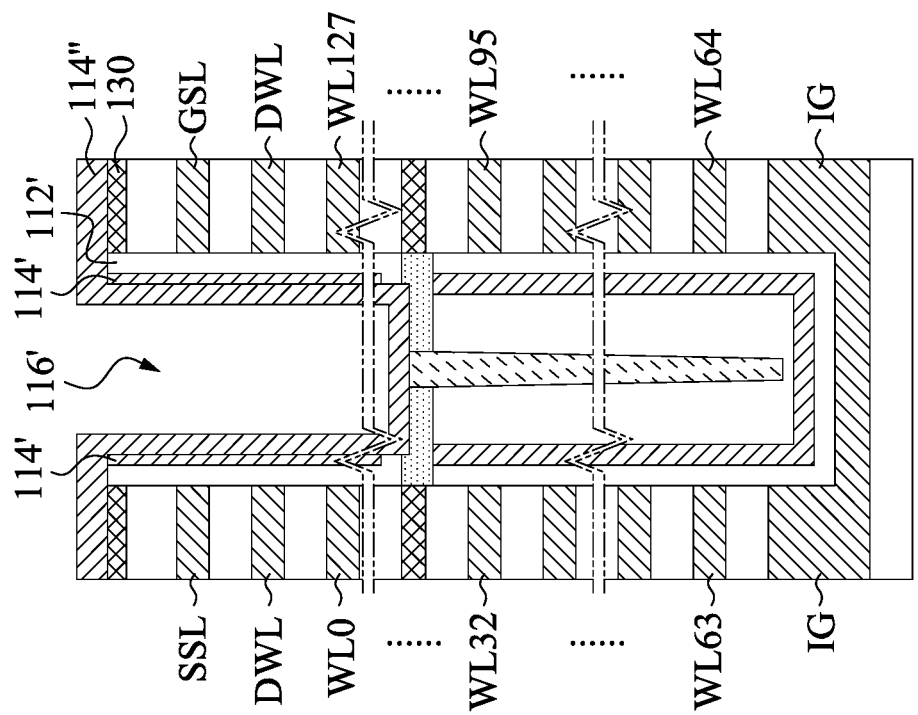
Figure 14A:
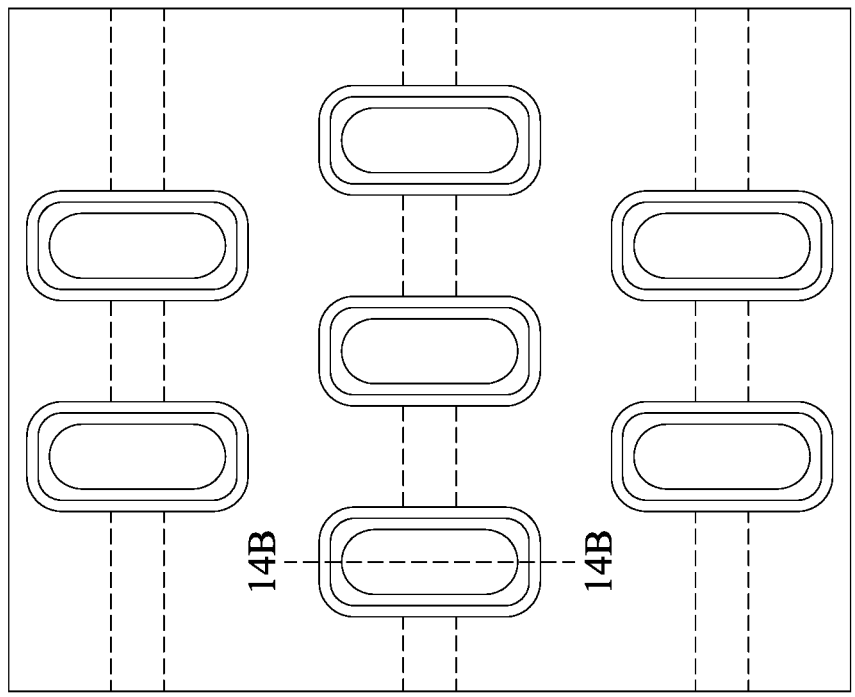

Reference is made to FIGS. 14A and 14B, and FIG. 14B illustrates a cross sectional view taken from the cross sectional line 14B-14B in FIG. 14A. Another channel layer 114" is formed by a deposition process, e.g., a low pressure chemical vapor deposition (LPCVD), into each hole 116' and over the upper half layer stack. The channel layer 114" is in contact with the channel layer 114' and the exposed top surfaces of the conductive plugs (120a, 120b) and the dielectric feature 124. The channel layer 114" and the channel layer 114' collectively constitute an upper channel portion with a bottom end in contact with the conductive plugs (120a, 120b).

Figure 15B:
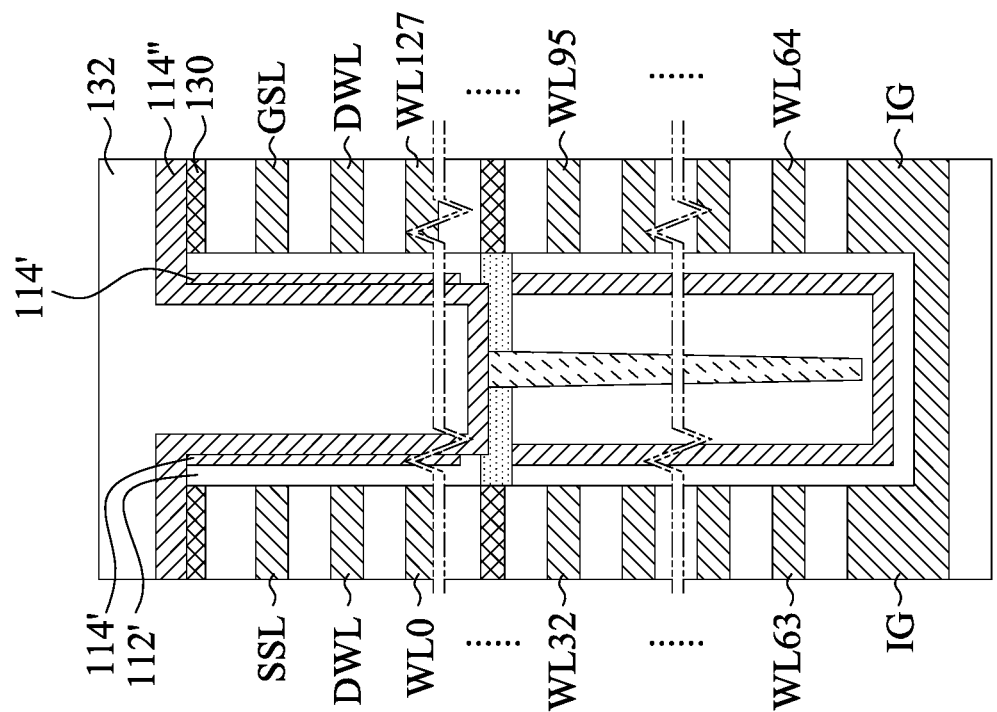
Figure 15A:
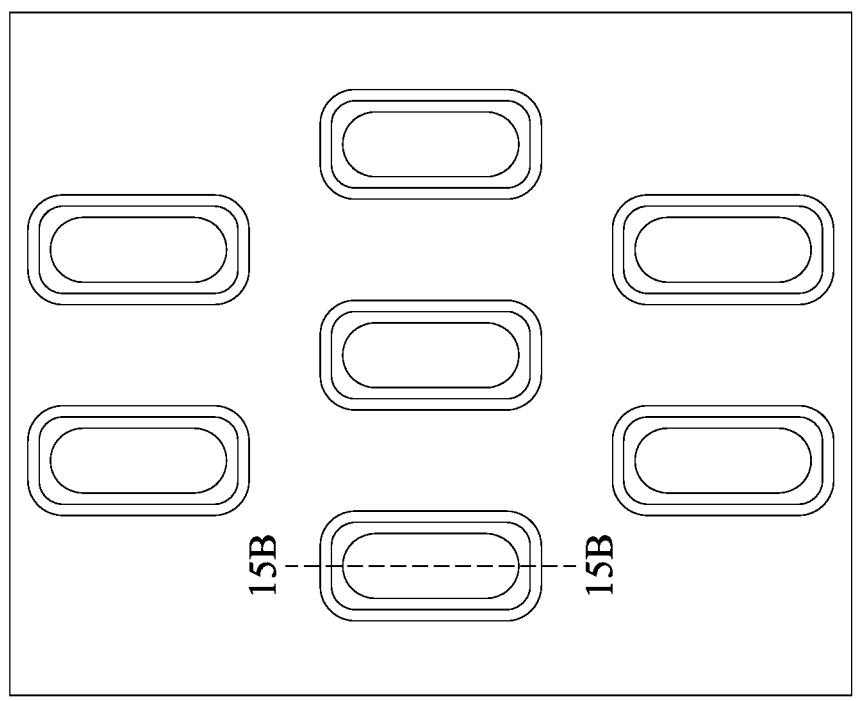

Reference is made to FIGS. 15A and 15B, and FIG. 15B illustrates a cross sectional view taken from the cross sectional line 15B-15B in FIG. 15A. Thereafter, a dielectric pillar 132 is formed into each hole 116' by deposit a dielectric material.

Figure 16B:
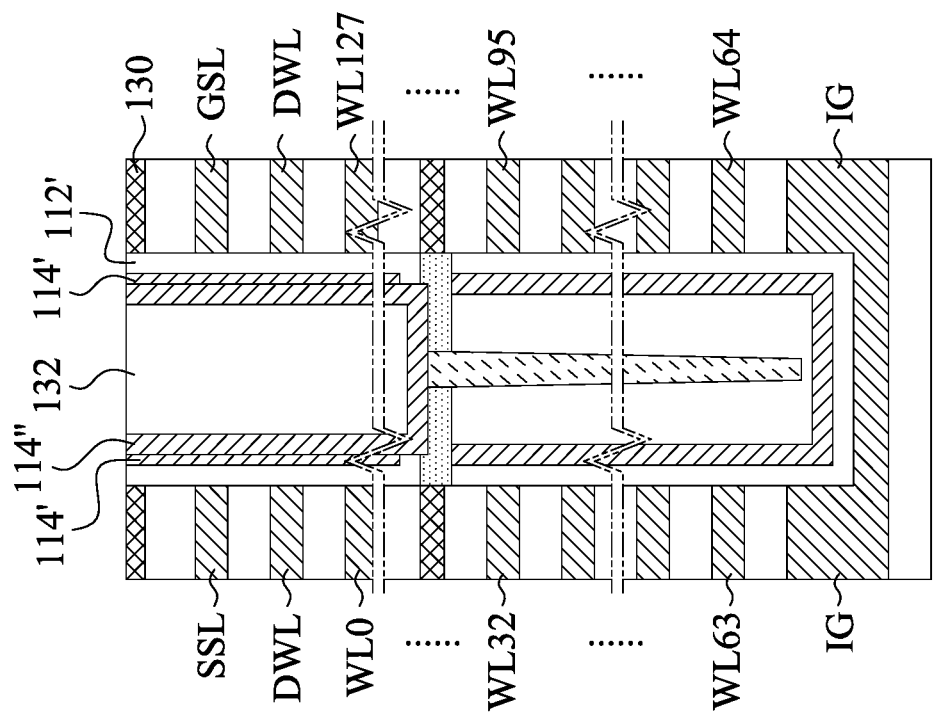
Figure 16A:
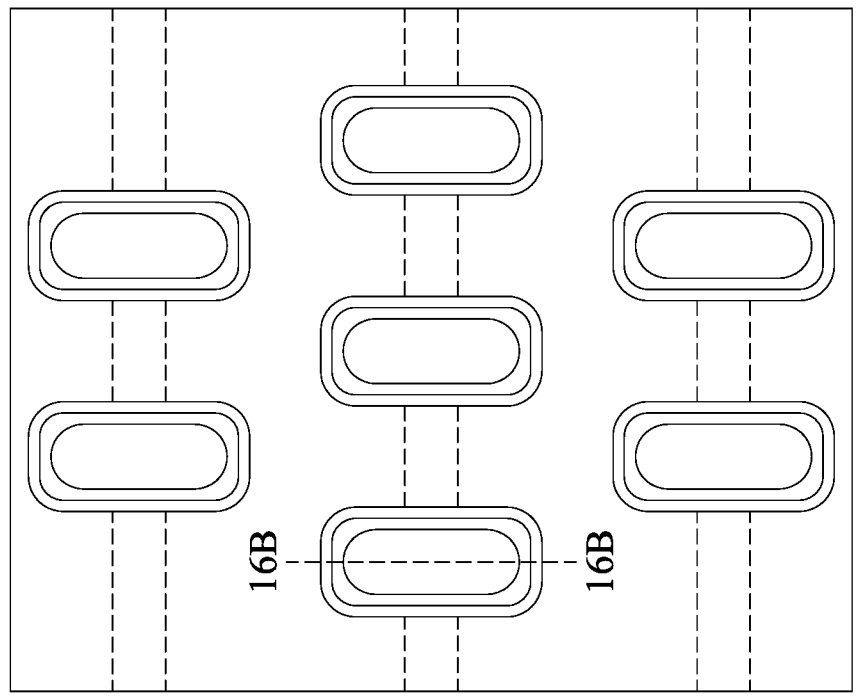

Reference is made to FIGS. 16A and 16B, and FIG. 16B illustrates a cross sectional view taken from the cross sectional line 16B-16B in FIG. 16A. A planarization process, e.g., a CMP process, using the etch stop layer 130 as a stop layer, is performed to remove excess channel layer 114' and dielectric pillar 132 above the etch stop layer 130. The etched channel layer 114" may be referred as an inner channel layer 114" that is in contact with a sidewall of an outer channel layer 114', i.e., the etched channel layer 114', to collectively constitute an upper channel portion. The outer channel layer 114' is sandwiched between the inner channel layer 114" and the storage layer 112'.

Figure 17B:
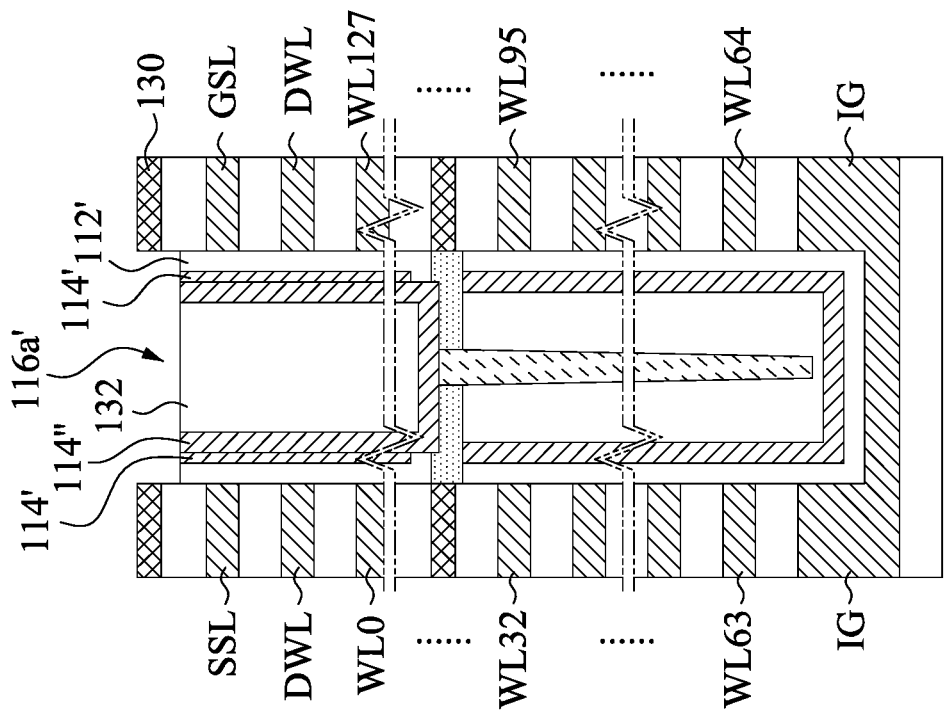
Figure 17A:
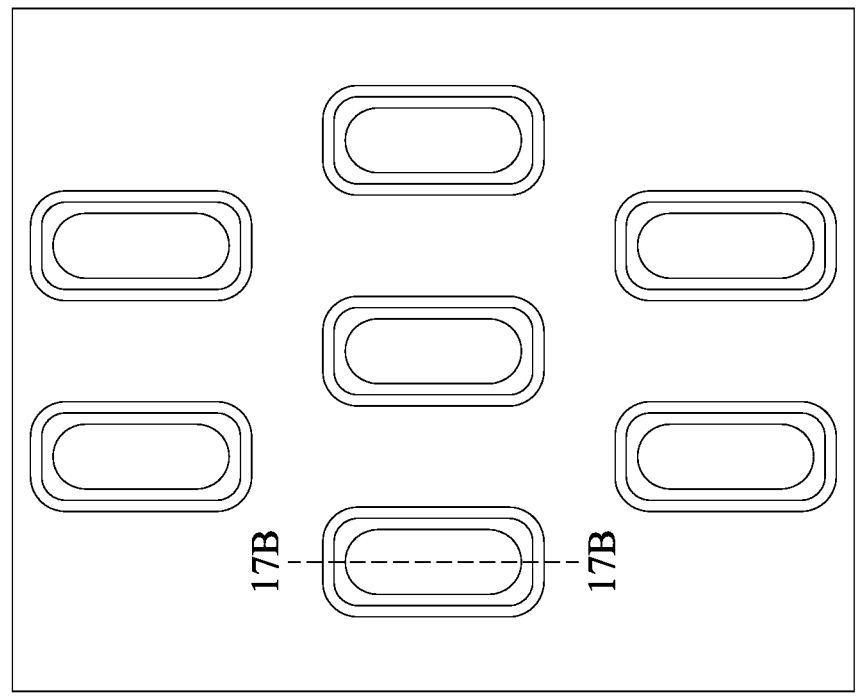

Reference is made to FIGS. 17A and 17B, and FIG. 17B illustrates a cross sectional view taken from the cross sectional line 17B-17B in FIG. 17A. An etching back process is then performed to remove top portions of the dielectric pillar 132, the storage layer 112' and the channel layer (114', 114") to form a recess 116a'.

Reference is made to FIGS. 18A and 18B, and FIG. 18B illustrates a cross sectional view taken from the cross sectional line 18B-18B in FIG. 18A. A conductive plug layer 136 is deposited into the recess 116a'. The material used to constitute the conductive plug layer may include doped or undoped semiconductor material (such as epitaxial single crystal silicon or poly-silicon (Si)/germanium (Ge) or other suitable material.

Figure 19B:
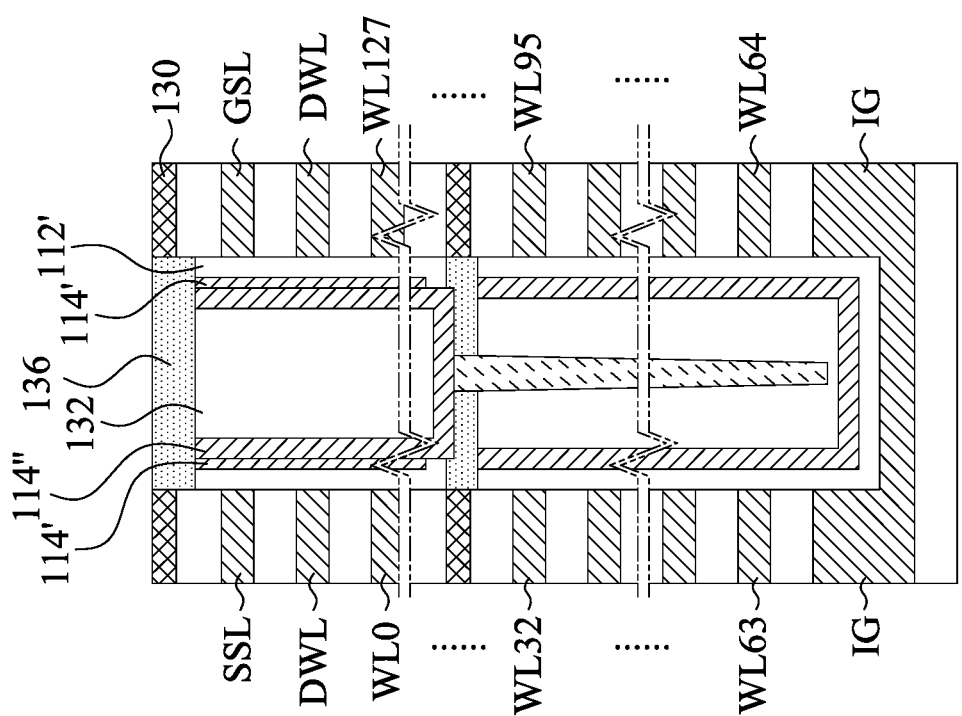
Figure 19A:
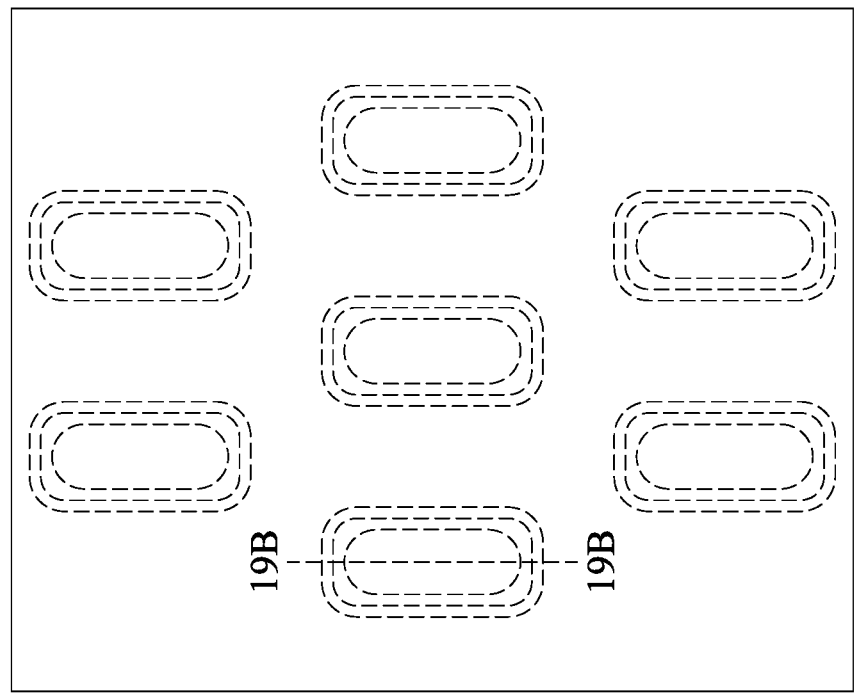

Reference is made to FIGS. 19A and 19B, and FIG. 19B illustrates a cross sectional view taken from the cross sectional line 19B-19B in FIG. 19A. Another planarization process, e.g., a CMP process, using the etch stop layer 130 as a stop layer, is performed to remove excess conductive plug layer materials. In this embodiment, the etch stop layer 130 is located at a side of the conductive plug layer 136 or aligned with the conductive plug layer 136. In some embodiments, the etch stop layer 130 and the conductive plug layer 136 may have flush, level top surfaces.

Figure 20B:
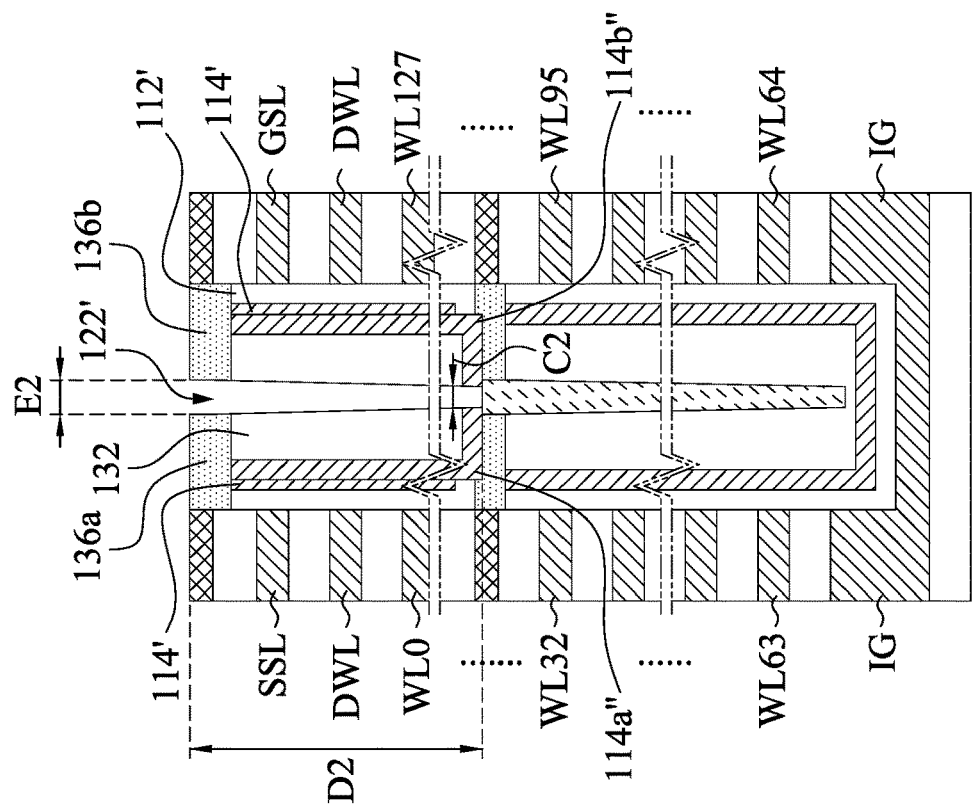
Figure 20A:
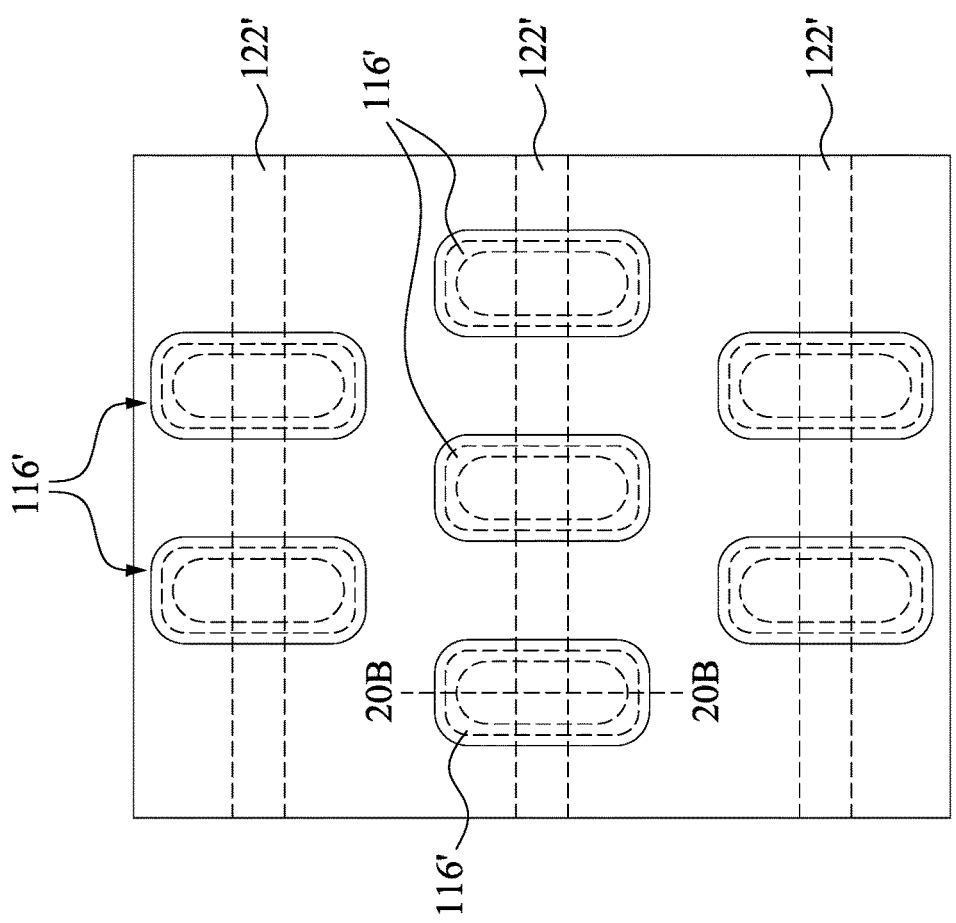

Reference is made to FIGS. 1, 20A and 20B, and FIG. 20B illustrates a cross sectional view taken from the cross sectional line 20B-20B in FIG. 20A. A silt trench 122' is etched across each row of the holes 116' to cut the conductive plug layer 136, the dielectric pillar 132, the storage layer 112' and the channel layers (114', 114"). The conductive plug layer 136 is thus divided into two conductive plugs (136a, 136b). The storage layer 112' is thus cut to form a U-shaped string portion 112a' located on a first side of a sidewall of each hole 116', a U-shaped string portion 112b' located on an opposite second side of the sidewall of each hole 116. The inner channel layer 114" is also cut to form an L-shaped channel portion 114a" and an L-shaped channel portion 114b" that are spaced from each other. The silt trench 122' is etched by using the etch stop layer 110 as a stop to expose a top of the dielectric feature 124. The string portions (112a, 112a') and string portions (112b, 112b') of the storage layer may be referred as a first string portion (112a, 112a') and a second string portion (112b, 112b') that are spaced from each other.

In this embodiment (referring to FIGS. 9B and 20B again), the silt trench 122' has a bottom inner width (C2) ranging from about 30 nm to about 60 nm, a top inner width (E2) from about 50 nm to about 80 nm and an inner depth (D2) ranging from about 1200 nm to about 2400 nm, but not being limited thereto. Thus, the silt trench 122' has a taper cross section from its top to its bottom. By utilizing 2-step etching scheme, a total aspect ratio, e.g., (D1+D2)/C1, of high density design, e.g., 64-layer or 96-layer vertical memory array can be relaxed. In other embodiments, 3 or more-step etching scheme may be utilized to relax a total aspect ratio of an even higher density design, e.g., 128-layer or more vertical memory array.

Figure 21B:
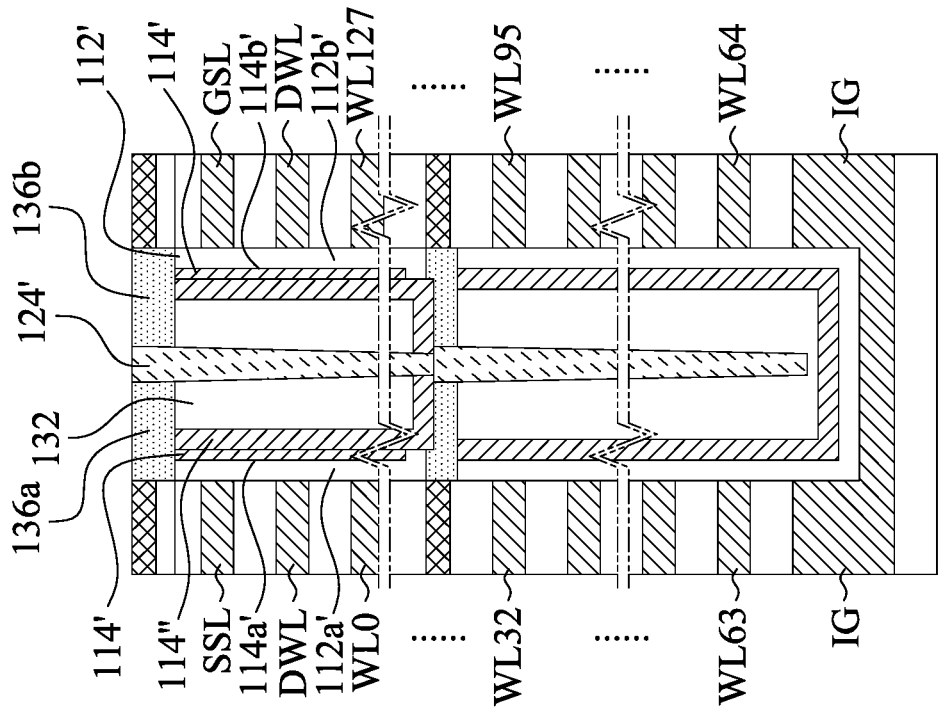
Figure 21A:
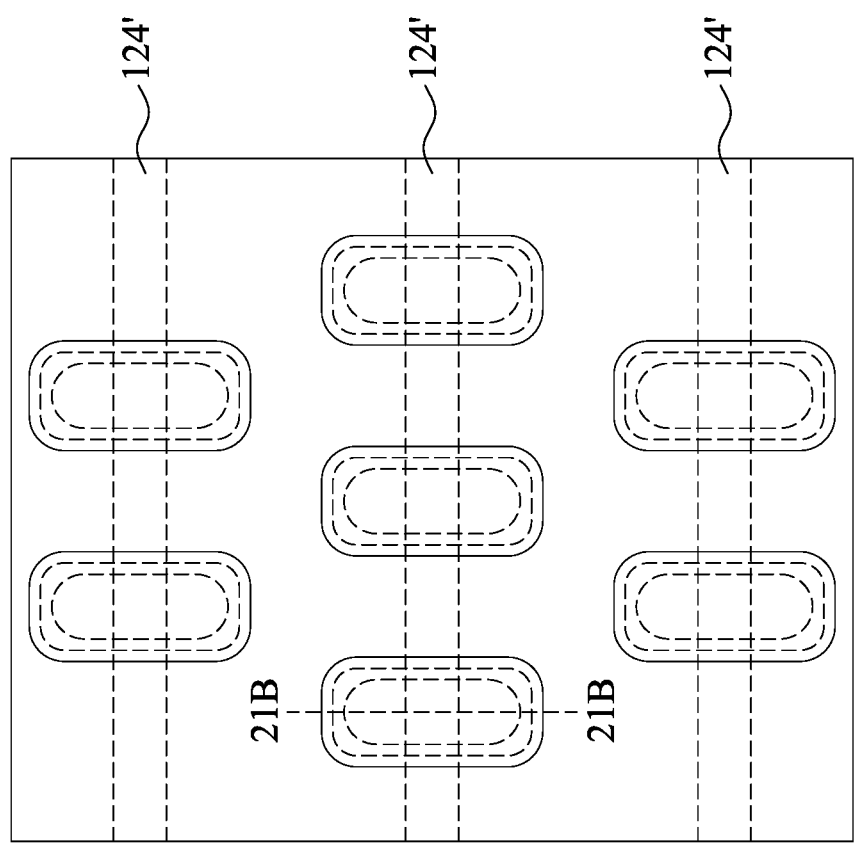

Reference is made to FIGS. 1, 21A and 21B, and FIG. 21B illustrates a cross sectional view taken from the cross sectional line 21B-21B in FIG. 21A. A dielectric material is then filled into the silt trench 122' to form a dielectric feature 124' embedded between the channel portions (114a', 114b') of the channel layers (114', 114"), between the string portions (112a', 112b') of the storage layer 112' as well as in the dielectric pillar 132 in the holes 116'. The upper dielectric feature 124' and the lower dielectric feature 124 form a continuous dielectric feature to divide a channel portion into two opposite U-shaped or hemi-cylindrical channel portion (114a, 114a', 114b, 114b') and the conductive plugs (120a, 120b) are interconnected between the upper channel portions (114a', 114b') and the lower channel portions (114a, 114b).

Figure 22B:
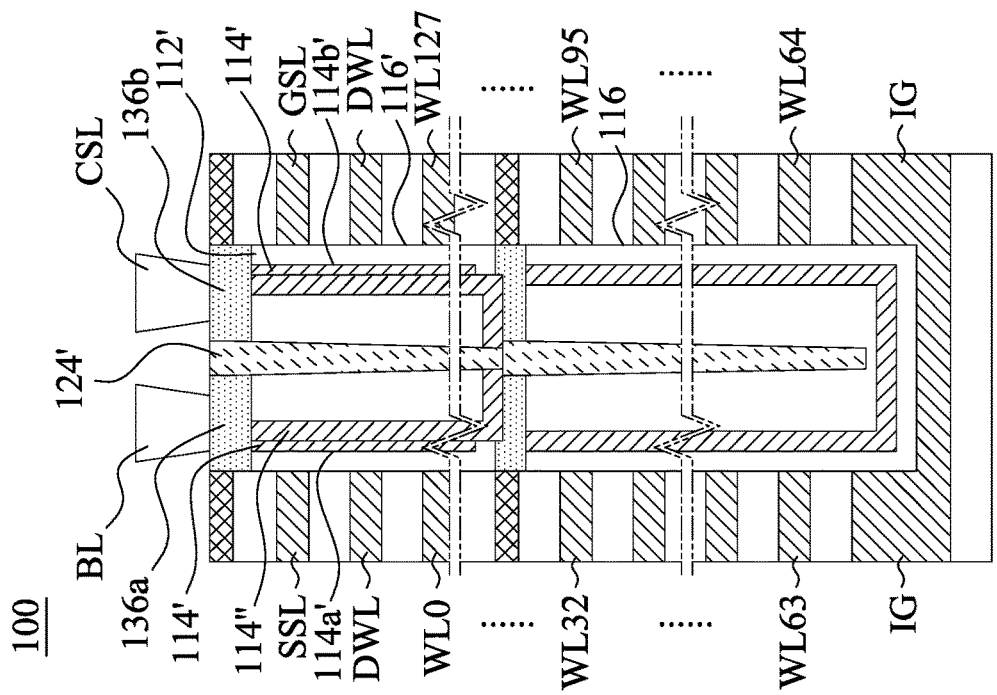
Figure 22A:
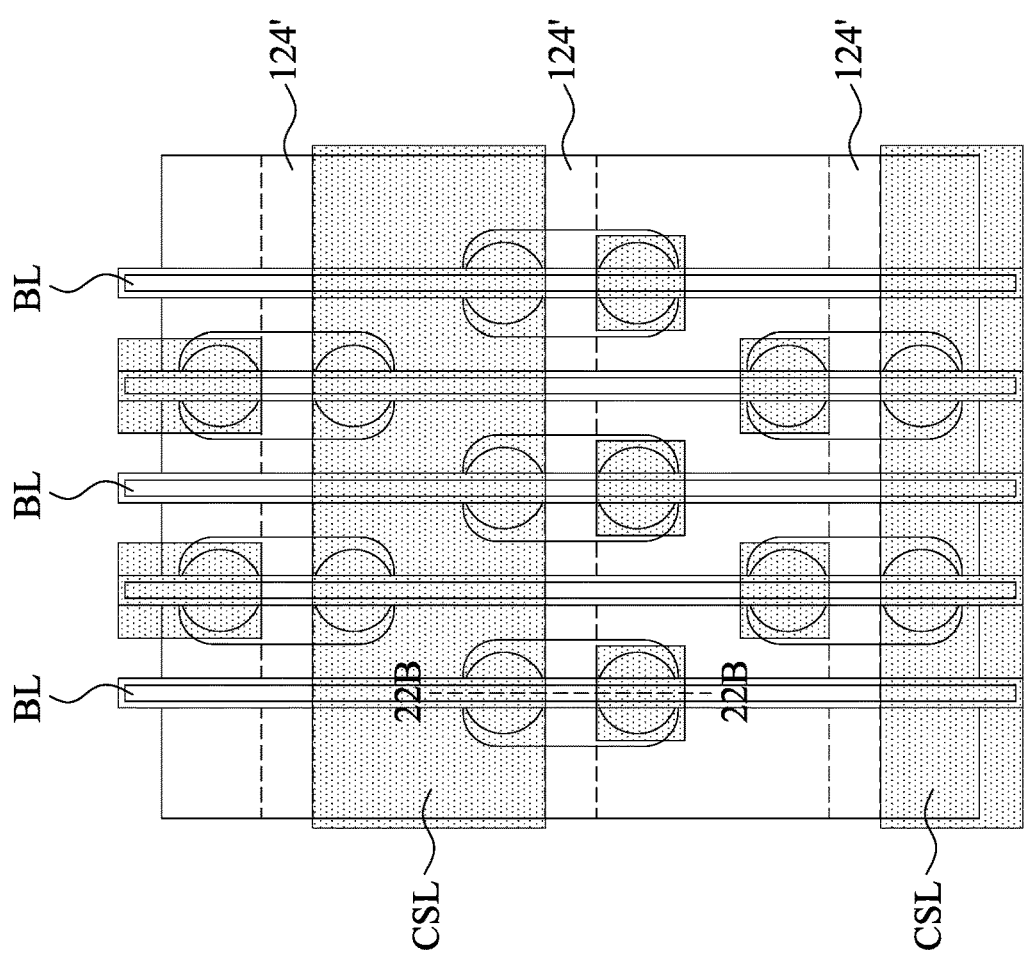
Figure 23B:
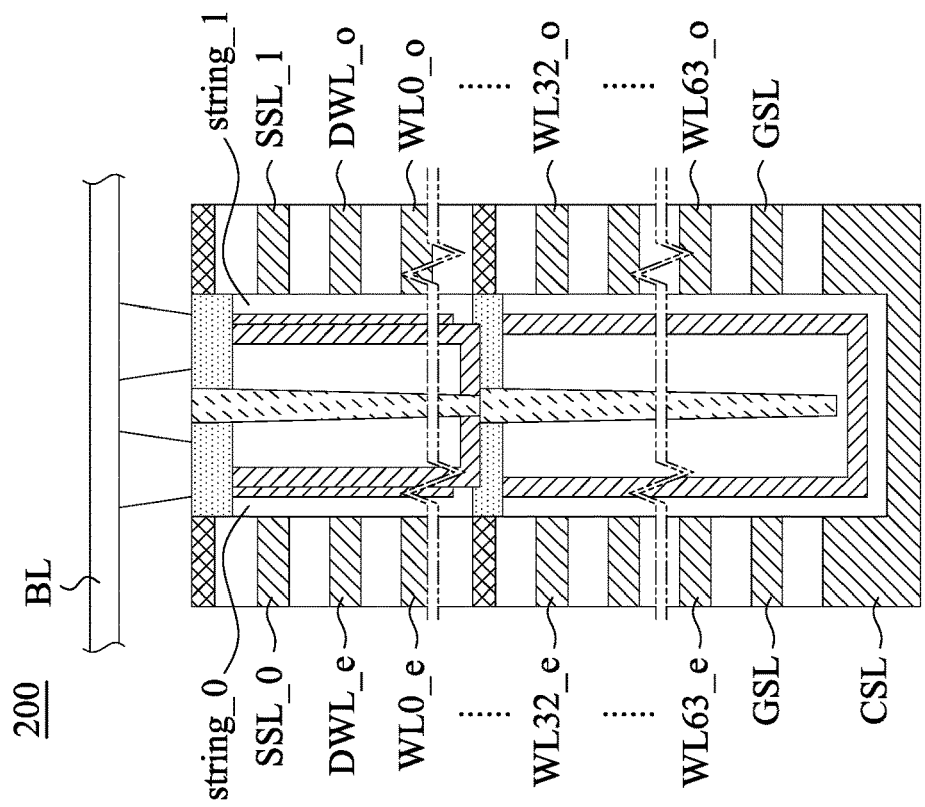
FIG. 23B illustrates a cross sectional view taken from the cross sectional line 23B-23B in FIG. 23A.
Figure 23A:
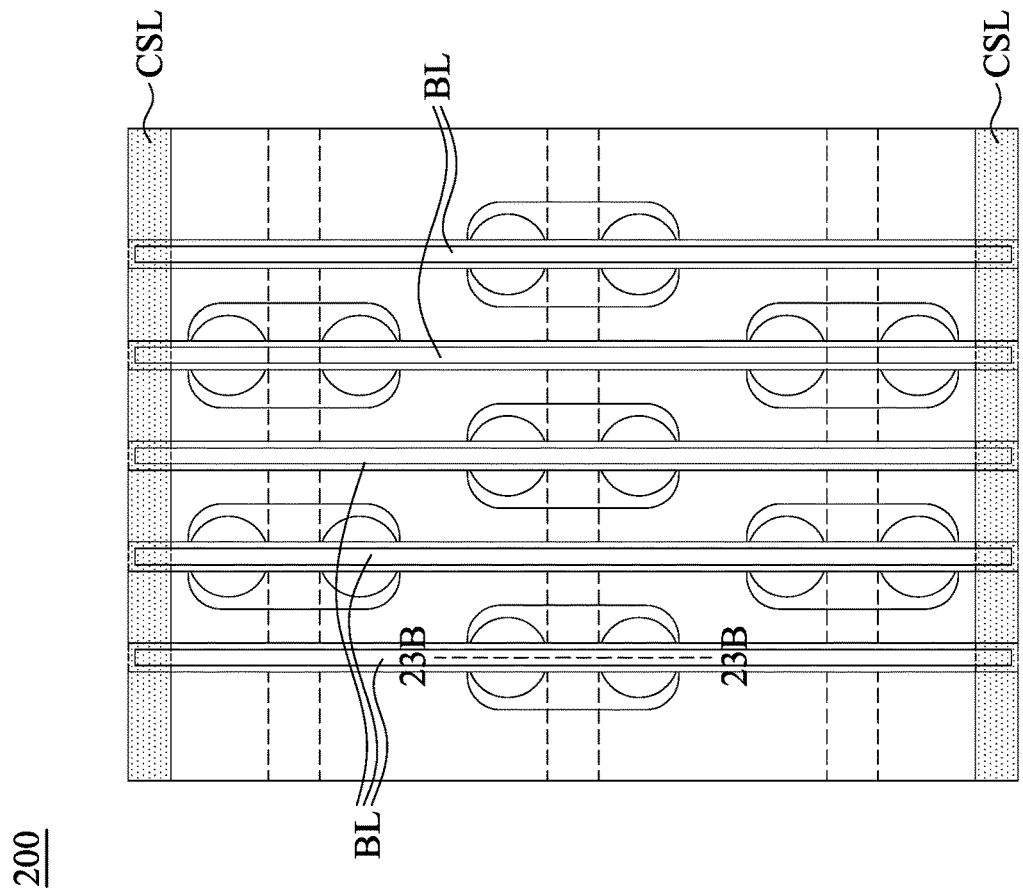
FIG. 23A a top view of a three dimensional semiconductor memory device in accordance with another embodiment of the present disclosure.
Figure 24:
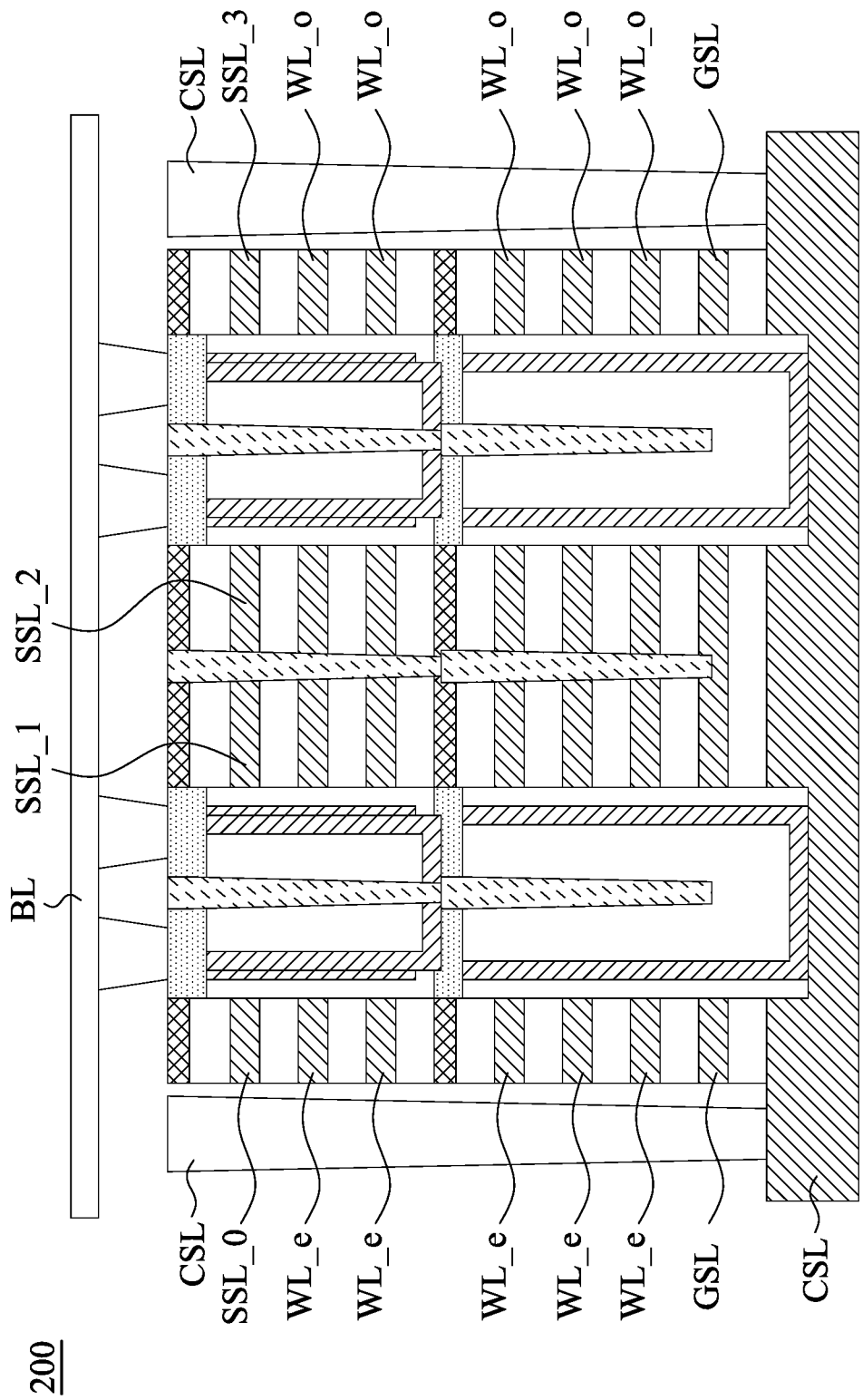
FIG. 24 illustrates a cross sectional view of a three dimensional semiconductor memory device in accordance with another embodiment of the present disclosure.

Reference is made to FIGS. 1, 22A and 22B, and FIG. 22B illustrates a cross sectional view taken from the cross sectional line 22B-22B in FIG. 22A. The 3D memory device 100 may include interconnection layers, i.e., bit lines (BL) and common source lines (CSL), to be connected to the vertical channel portions in the holes (116, 116'). In particular, the two conductive plugs (136a, 136b) are formed at an opening end of each hole (116, 116') and in contact with the channel portions (114a', 114b') respectively. One of the two conductive plugs (136a, 136b) is connected to a bit line (BL) and the other of the two conductive plugs (136a, 136b) is connected to a common source line (CSL). Therefore, all memory cells of the memory device 100 can be connected to the interconnection layers.

Reference is made to FIGS. 1, 23A, 23B and 24. The memory device 200 is different from the memory device 100 mainly in that the bottom string portion 112c of the memory device 100 is absent in the memory device 200 such that memory cells of the string portion 112a and the string portion 112b are not connected as the same string. For example, a storage layer string_0 corresponds to a string select line (SSL_0), a dummy word line (DWL_e), multiple word lines (WL0_e-WL63_e) and a gate select line (GSL) while a storage layer string_1 corresponds to a string select line (SSL_1), a dummy word line (DWL_o), multiple word lines (WL0_o-WL63_o) and a gate select line (GSL). The 3D memory device 200 further includes bit lines (BL) connected to all conductive plugs (136a, 136b) and a common source line (CSL) connected to bottom ends of all channel portions (114a, 114a', 114b, 114b'). Therefore, the memory device 200 also has an interconnection layer configuration different from that of the memory device 100.

According to aforementioned embodiments, a hemi-cylindrical semiconductor memory device utilizes a multiple-step etching scheme to relax a total aspect ratio of a higher density design such that a conventional etching tool with a normal etching capability is still able to fabricate a hemi-cylindrical semiconductor memory device with higher density design.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A three-dimensional (3D) memory device, comprising:
   a substrate;
   a plurality of conductive layers and insulating layers alternately stacked over the substrate to form a multi-layer stacked structure;
   a storage layer penetrating through the multi-layer stacked structure, and having a first string portion and a second string portion that are spaced from each other;

a first channel disposed on a lateral side of the first string portion, and the first string portion is disposed between the multi-layer stacked structure and the first channel;

a second channel disposed on a lateral side of the second string portion, and the second string portion is disposed between the multi-layer stacked structure and the second channel, wherein the first channel and the second channel have an upper channel portion and a lower channel portion;

a first conductive plug interconnected between the upper channel portion and the lower channel portion of the first channel;

a second conductive plug, interconnected between the upper channel portion and the lower channel portion of the second channel;

an etch stop layer disposed in the multi-layer stacked structure a top surface of the etch stop layer and a top surface of portions of the first and second conductive duos are coplanar; and a dielectric feature disposed between the first channel and the second channel, wherein the upper channel portion comprises an outer channel layer and an inner channel layer, the outer channel layer is disposed between the storage layer and the inner channel layer and spaced from the first conductive plug, wherein the inner channel layer is in contact with the second conductive plug, wherein the dielectric feature comes in direct contact with the first conductive plug and the second conductive plug, and wherein the first channel is disposed between the first string portion and the dielectric feature, the second channel is disposed between the second string portion and the dielectric feature.

2. The 3D memory device of claim 1, wherein the etch stop layer is disposed at a side of the first conductive plug.

3. The 3D memory device of claim 1, wherein the upper channel portion has a bottom end in contact with the first conductive plug.

4. The 3D memory device of claim 1 further comprising an etch stop layer above the multi-layer stacked structure.

5. The 3D memory device of claim 1, wherein the first conductive plug and the second conductive plug comprise doped poly silicon.

6. The 3D memory device of claim 1, wherein the inner channel layer of the first channel is spaced from the inner channel layer of the second channel.

7. The 3D memory device of claim 1, wherein the inner channel layer of the first channel has a first vertical segment and a first lateral segment, and the first lateral segment is in contact with the first conductive plug, wherein the inner channel layer of the second channel has a second vertical segment and a second lateral segment, and the second lateral segment is in contact with the second conductive plug, and wherein the second lateral segment is spaced from the first lateral segment by the dielectric feature.

8. The 3D memory device of claim 2, wherein the etch stop layer is made from dielectric materials different from that of the insulating layers.

9. A three-dimensional (3D) memory device, comprising:
a substrate;
a plurality of conductive layers and insulating layers alternately stacked over the substrate to form a multi-layer stacked structure;
a storage layer penetrating through the multi-layer stacked structure, and having a first string portion and a second string portion that are spaced from each other;
a first channel in contact with the first string portion and having an upper channel portion and a lower channel portion; a second channel in contact with the second string portion and having an upper channel portion and a lower channel portion;
a first conductive plug interconnected between the upper channel portion and the lower channel portion of the first channel;
a second conductive plug interconnected between the upper channel portion and the lower channel portion of the second channel;
an etch stop layer disposed in the multi-layer stacked structure a top surface of the etch stop layer and a top surface of portions of the first and second conductive plugs are coplanar;
and a dielectric feature disposed between the first channel and the second channel, the dielectric feature having a lower portion and an upper portion, and a top of the lower portion having a cross section wider than that of a bottom of the upper portion,
wherein the first channel is disposed between the first string portion and the dielectric feature, the second channel is disposed between the second string portion and the dialectic feature, wherein the dielectric feature comes in direct contact with the first conductive plug and the second conductive plug.

10. The 3D memory device of claim 9, wherein the upper portion or the lower portion of the dielectric feature comprise a taper cross section.

11. The 3D memory device of claim 9, wherein the etch stop layer is aligned with the first conductive plug.

12. The 3D memory device of claim 9, further comprising a third conductive plug above the multi-layer stacked structure and connected to the upper channel portion of the first channel.

13. The 3D memory device of claim 12 further comprising an etch stop layer above the multi-layer stacked structure and aligned with the third conductive plug.

14. The 3D memory device of claim 12 wherein the first conductive plug and the second conductive plug comprise doped poly silicon.

15. The 3D memory device of claim 9, wherein the upper channel portion comprises an outer channel layer and an inner channel layer, the outer channel layer is disposed between the storage layer and the inner channel layer and spaced from the first conductive plug.

* * * * *